US012132044B2

(12) United States Patent
Kim et al.

(10) Patent No.: US 12,132,044 B2
(45) Date of Patent: Oct. 29, 2024

(54) SEMICONDUCTOR DEVICE INCLUDING AN UPPER CONTACT IN CONTACT WITH A SIDE SURFACE OF AN UPPER GATE STRUCTURE

(71) Applicant: SAMSUNG ELECTRONICS CO., LTD., Suwon-si (KR)

(72) Inventors: Sung Min Kim, Incheon (KR); Dae Won Ha, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 502 days.

(21) Appl. No.: 16/734,786

(22) Filed: Jan. 6, 2020

(65) Prior Publication Data

US 2020/0294995 A1    Sep. 17, 2020

(30) Foreign Application Priority Data

Mar. 11, 2019   (KR) .................. 10-2019-0027488

(51) Int. Cl.
 *H01L 27/06*    (2006.01)
 *H01L 21/768*   (2006.01)
 (Continued)

(52) U.S. Cl.
 CPC .... *H01L 27/0688* (2013.01); *H01L 21/76898* (2013.01); *H01L 21/8221* (2013.01);
 (Continued)

(58) Field of Classification Search
 CPC .............. H01L 27/0688; H01L 27/088; H01L 29/4175; H01L 29/78391; H01L 29/7843;
 (Continued)

(56) References Cited

U.S. PATENT DOCUMENTS 5,146,300 A * 9/1992 Hamamoto ............ H10B 12/00
                                             438/210
5,438,023 A * 8/1995 Argos, Jr. ........... H01L 23/3192
                                             438/763
(Continued)

FOREIGN PATENT DOCUMENTS

KR    10-2011-0043867 A    4/2011

OTHER PUBLICATIONS

1st OA issued in corresponding Korean application No. KR 10-2019-0027488 on Apr. 20, 2024.

*Primary Examiner* — David Chen
(74) *Attorney, Agent, or Firm* — F. CHAU & ASSOCIATES, LLC

(57) ABSTRACT

A semiconductor device including: a lower semiconductor substrate; an upper semiconductor substrate overlapping the lower semiconductor substrate, the upper semiconductor substrate including a first surface and a second surface opposite to the first surface; an upper gate structure on the first surface of the upper semiconductor substrate; a first interlayer insulation film which covers the upper gate structure, wherein the first interlayer insulation film is between the lower semiconductor substrate and the upper semiconductor substrate; and an upper contact connected to the lower semiconductor substrate, wherein the upper contact is on a side surface of the upper gate structure, wherein the upper contact includes a first portion penetrating the upper semiconductor substrate, and a second portion having a side surface adjacent to the side surface of the upper gate structure, and a width of the first portion decreases toward the second surface.

15 Claims, 29 Drawing Sheets

(51) Int. Cl.
  *H01L 21/822* (2006.01)
  *H01L 23/528* (2006.01)
  *H01L 27/088* (2006.01)
  *H01L 27/146* (2006.01)
  *H01L 29/417* (2006.01)
  *H01L 29/78* (2006.01)
(52) U.S. Cl.
  CPC ........ *H01L 23/5283* (2013.01); *H01L 27/088* (2013.01); *H01L 27/14636* (2013.01); *H01L 29/4175* (2013.01); *H01L 29/78391* (2014.09); *H01L 29/7843* (2013.01); *H01L 2225/06541* (2013.01)
(58) Field of Classification Search
  CPC ............. H01L 23/481; H01L 21/76898; H01L 2225/06541; H01L 25/0657; H01L 2224/08145; H01L 23/5226; H01L 21/8221; H01L 27/14636; H01L 23/5283
  USPC ......... 257/774, 777, 21.614, 23.011, 27.026; 438/107, 455, 618, 637
  See application file for complete search history.

(56) References Cited

U.S. PATENT DOCUMENTS

| | | | |
|---|---|---|---|
| 5,750,419 A * | 5/1998 | Zafar | H01L 27/11507 257/E21.664 |
| 7,041,576 B2 | 5/2006 | Pozder et al. | |
| 8,139,387 B2 | 3/2012 | Park et al. | |
| 9,018,078 B2 | 4/2015 | Sklenard et al. | |
| 9,263,405 B2 * | 2/2016 | Miao | H01L 24/11 |
| 9,536,980 B1 * | 1/2017 | Huang | H01L 29/6653 |
| 9,773,809 B2 | 9/2017 | Lin et al. | |
| 9,799,675 B2 | 10/2017 | Bedell et al. | |
| 9,818,615 B2 | 11/2017 | Blanchard et al. | |
| 9,837,534 B2 | 12/2017 | Yokoyama | |
| 2002/0025669 A1* | 2/2002 | Hwang | H10B 12/485 257/E21.507 |
| 2004/0198005 A1* | 10/2004 | Lee | H01L 21/28052 257/E21.507 |
| 2005/0275017 A1 | 12/2005 | Pozder et al. | |
| 2008/0087932 A1* | 4/2008 | Son | H10B 69/00 257/315 |
| 2008/0231340 A1* | 9/2008 | Shiraki | H01L 27/0251 327/333 |
| 2009/0127626 A1* | 5/2009 | Zhu | H01L 29/7846 257/E21.546 |
| 2010/0213458 A1* | 8/2010 | Prall | H10B 41/20 257/43 |
| 2012/0083106 A1* | 4/2012 | Zhu | H01L 29/7847 438/585 |
| 2013/0049127 A1* | 2/2013 | Chen | H01L 21/76898 257/369 |
| 2013/0126814 A1* | 5/2013 | Kim | H10N 70/026 257/E45.002 |
| 2015/0060967 A1* | 3/2015 | Yokoyama | H01L 27/14689 257/295 |
| 2015/0091066 A1* | 4/2015 | Lee | H01L 25/0657 257/369 |
| 2015/0263044 A1* | 9/2015 | Yamasaki | H01L 23/485 257/67 |
| 2016/0293664 A1* | 10/2016 | Yokoyama | H01L 21/84 |
| 2017/0207169 A1* | 7/2017 | Lee | H01L 24/27 |
| 2017/0271399 A1* | 9/2017 | Lee | H01L 43/065 |
| 2017/0358497 A1* | 12/2017 | Cheng | H01L 29/0649 |
| 2018/0053748 A1 | 2/2018 | Lu et al. | |
| 2018/0240797 A1* | 8/2018 | Yokoyama | H01L 25/074 |
| 2019/0148342 A1* | 5/2019 | Hu | H01L 25/03 257/659 |
| 2019/0363130 A1* | 11/2019 | Yokoyama | H01L 43/08 |

* cited by examiner

SEMICONDUCTOR DEVICE INCLUDING AN UPPER CONTACT IN CONTACT WITH A SIDE SURFACE OF AN UPPER GATE STRUCTURE

CROSS-REFERENCE TO RELATED APPLICATION

This application claims priority under 35 U.S.C. § 119 to Korean Patent Application No. 10-2019-0027488, filed on Mar. 11, 2019, the disclosure of which is incorporated by reference herein in its entirety.

1. Technical Field

The present inventive concept relates to a semiconductor device and a method for fabricating the same. More specifically, the present inventive concept relates to a three-dimensionally stacked semiconductor device and a method for fabricating the same.

2. Description of the Related Art

As one example of a scaling technique for increasing the density of semiconductor devices, a multi gate transistor, which has a multi-channel active pattern (or a silicon body) in the form of fin or nanowire, is formed on a substrate and a gate is formed on a surface of the multi-channel active pattern.

To further increase the density of semiconductor devices, a technique for stacking the semiconductor devices three-dimensionally through wafer bonding may be employed.

SUMMARY

According to an exemplary embodiment of the present inventive concept, there is provided a semiconductor device including: a lower semiconductor substrate; an upper semiconductor substrate overlapping the lower semiconductor substrate, the upper semiconductor substrate including a first surface and a second surface opposite to the first surface; an upper gate structure on the first surface of the upper semiconductor substrate; a first interlayer insulation film which covers the upper gate structure, wherein the first interlayer insulation film is between the lower semiconductor substrate and the upper semiconductor substrate; and an upper contact connected to the lower semiconductor substrate, wherein the upper contact is on a side surface of the upper gate structure, wherein the upper contact includes a first portion penetrating the upper semiconductor substrate, and a second portion having a side surface adjacent to the side surface of the upper gate structure, and a width of the first portion decreases toward the second surface.

According to an exemplary embodiment of the present inventive concept, there is provided a semiconductor device including: a lower semiconductor substrate; a lower gate structure on a surface of the lower semiconductor substrate; a lower interlayer insulation film on the lower semiconductor substrate, wherein the lower interlayer insulation film covers the lower gate structure; an upper semiconductor substrate overlapping the lower interlayer insulation film, wherein the upper semiconductor substrate includes a first surface and a second surface opposite to the first surface; an upper gate structure on the first surface of the upper semiconductor substrate; an upper interlayer insulation film on the upper semiconductor substrate, wherein the upper interlayer insulation film covers the upper gate structure; and an upper contact on a side surface of the upper gate structure, wherein the upper contact penetrates the upper semiconductor substrate and the upper interlayer insulation film, wherein a width of the upper contact at the same level as the second surface is smaller than a width of the upper contact at the same level as the first surface, and at least a part of a side surface of the upper contact contacts the side surface of the upper gate structure.

According to an exemplary embodiment of the present inventive concept, there is provided a semiconductor device including: a lower semiconductor substrate; a conductive pad on the lower semiconductor substrate; an upper semiconductor substrate overlapping the lower semiconductor substrate, wherein the upper semiconductor substrate includes a first surface and a second surface opposite to the first surface; an upper gate structure on the first surface of the upper semiconductor substrate, wherein the upper gate structure includes an upper gate electrode and an insulation structure on a side surface and a bottom surface of the upper gate electrode; an upper interlayer insulation film between the first surface of the upper semiconductor substrate and the conductive pad; and an upper contact penetrating the upper semiconductor substrate and the upper interlayer insulation film and connected to the conductive pad, wherein the upper contact is on a side surface of the upper gate structure, wherein a side surface of the insulation structure includes a first recess adjacent to a bottom surface of the insulation structure, and a first part of the upper contact is disposed in the first recess.

According to an exemplary embodiment of the present inventive concept, there is provided a method for fabricating a semiconductor device, the method including: forming a dower interlayer insulation film on a lower semiconductor substrate; forming an upper gate structure on a first surface of an upper semiconductor substrate; forming an upper interlayer insulation film on the upper semiconductor substrate, wherein the upper interlayer insulation film covers the upper gate structure; forming a contact hole penetrating the upper interlayer insulation film and the upper semiconductor substrate, using a self-aligned contact (SAC) process; forming a dummy contact in the contact hole, coupling the lower interlayer insulation film and the upper interlayer insulation film; and replacing the dummy contact to form an upper contact connected to the lower semiconductor substrate.

According to an exemplary embodiment of the present inventive concept, there is provided a semiconductor device including: a first semiconductor substrate; a second semiconductor substrate overlapping the first semiconductor substrate, the second semiconductor substrate including a first surface and a second surface opposite to the first surface; a gate structure on the first surface of the second semiconductor substrate; an interlayer insulation film overlapping the gate structure, wherein the interlayer insulation film is between the first semiconductor substrate and the second semiconductor substrate; and a contact connected to the first semiconductor substrate, wherein the contact includes a first portion passing through the second semiconductor substrate, and a second portion having a protrusion disposed in a recess at a side of the gate structure.

BRIEF DESCRIPTION OF THE DRAWINGS

The above and other features of the present inventive concept will become more apparent by describing in detail exemplary embodiments thereof with reference to the attached drawings, in which.

DETAILED DESCRIPTION OF THE EMBODIMENTS

Figure 1:
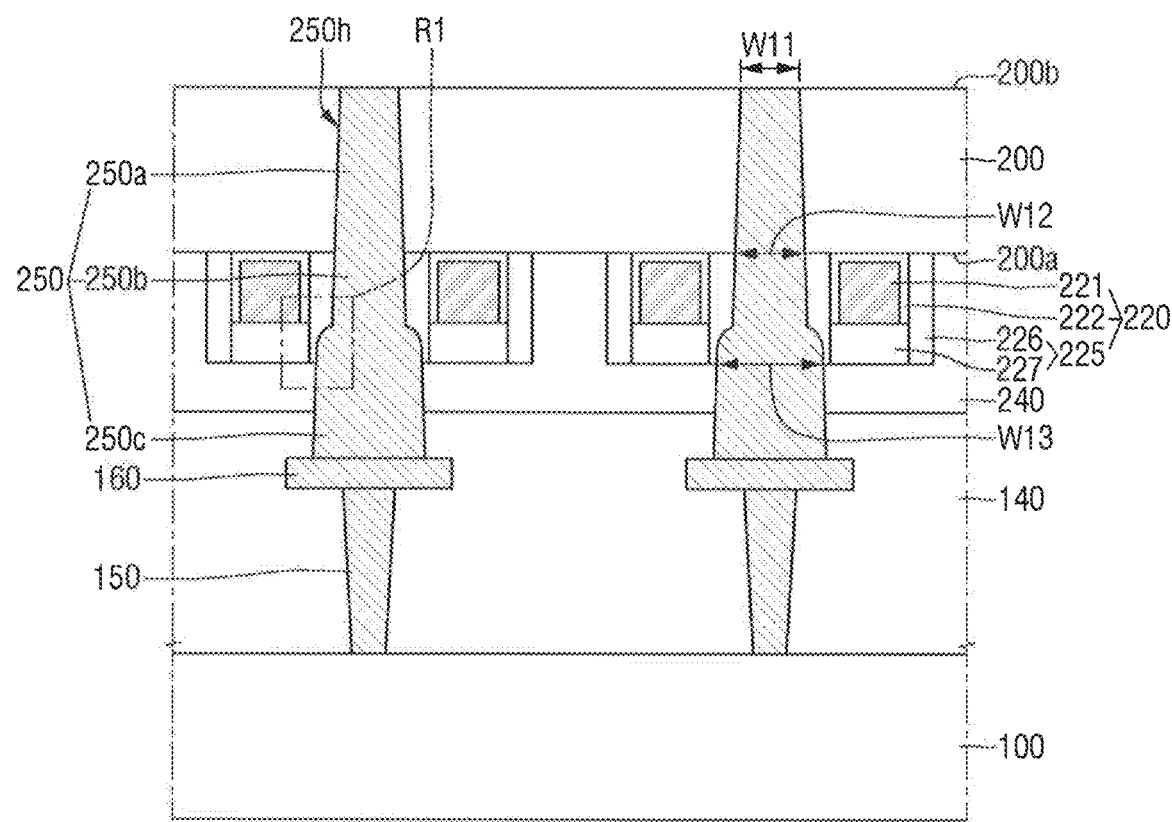
FIG. 1 is a cross-sectional view illustrating a semiconductor device according to exemplary embodiments of the present inventive concept.

Hereinafter, a semiconductor device according to exemplary embodiments of the present inventive concept will be described with reference to FIGS. 1 through 20.

In the drawings (e.g., FIG. 1) of the semiconductor device according to exemplary embodiments of the present inventive concept, a semiconductor element formed on the upper semiconductor substrate is illustrated as being a planar transistor (e.g., a field effect transistor (FET) or a fin type transistor (e.g., a FinFET) as an example, but the present inventive concept is not limited thereto. For example, in the semiconductor device according to exemplary embodiments of the present inventive concept, the semiconductor element formed on the upper semiconductor substrate may include a buried channel array transistor (BCAT), a recess channel array transistor (RCAT), a tunneling transistor (e.g., a tunneling FET), a transistor including a nanowire, a transistor including a nanosheet or a vertical transistor (e.g., a vertical FET).

In the drawings (e.g., FIG. 3) of the semiconductor device according to exemplary embodiments of the present inventive concept, it is illustrated that a transistor formed on a lower semiconductor substrate and a transistor formed on the upper semiconductor substrate are the same form of transistor, but the present inventive concept is not limited thereto. For example, in the semiconductor device according to exemplary embodiments of the present inventive concept, the semiconductor element formed on the lower semiconductor substrate and the semiconductor element formed on the upper semiconductor substrate may have different forms from.

For example, the semiconductor element formed on the lower semiconductor substrate may include a memory cell, and the semiconductor element formed on the upper semiconductor substrate may be a logic element. As another example, the semiconductor element formed on the lower semiconductor substrate may be a logic element, and the semiconductor element formed on the upper semiconductor substrate may include a memory cell. In yet another example, logic elements including different forms of transistors may be formed on the lower semiconductor substrate and the upper semiconductor substrate, respectively.

The memory cell may be a volatile memory element or a nonvolatile memory element. The memory cell may be, for example, but is not limited to, a dynamic random access memory (DRAM), a static RAM (SRAM), a flash memory element or the like.

Figure 2:
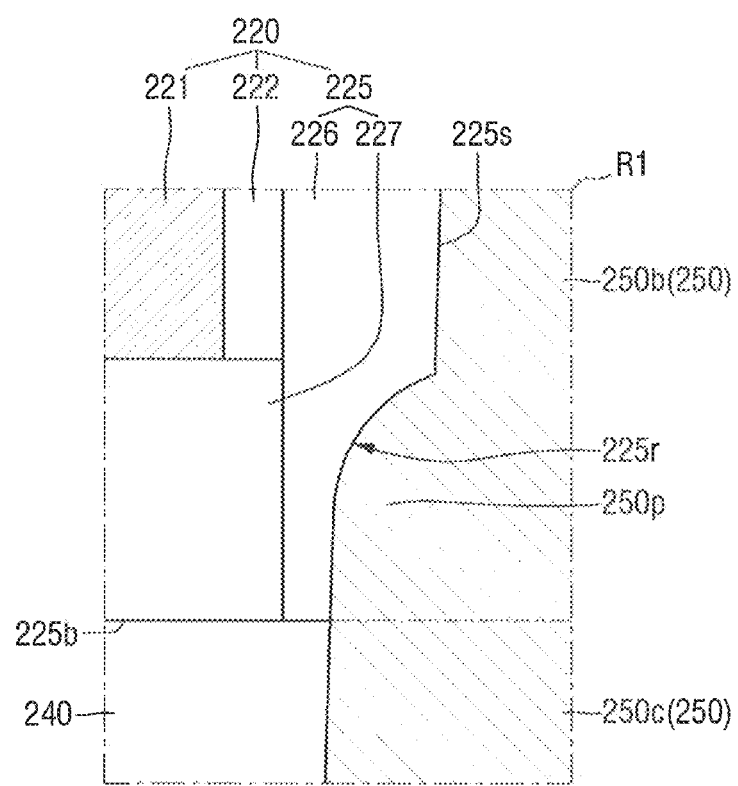
FIG. 2 is an enlarged view of a region R1 of FIG. 1.

FIG. 1 is a cross-sectional view illustrating the semiconductor device according to exemplary embodiments of the present inventive concept. FIG. 2 is an enlarged view of a region R1 of FIG. 1.

Referring to FIGS. 1 and 2, the semiconductor device includes a lower semiconductor substrate 100, a first upper semiconductor substrate 200, a first upper gate structure 220, first interlayer insulation films 140 and 240 and a first upper contact 250.

The lower semiconductor substrate 100 and the first upper semiconductor substrate 200 may be bulk silicon or silicon-on-insulator (SOI), respectively. Alternatively, the lower semiconductor substrate 100 and the first upper semiconductor substrate 200 may be silicon substrates, or may include other materials, for example, but not limited to, silicon germanium, silicon germanium on insulator (SGOI), antimony indium, a lead tellurium compound, indium arsenide, indium phosphide, gallium arsenide or gallium antimonide.

The first upper semiconductor substrate 200 may include a first surface 200a and a second surface 200b opposite to each other. The first surface 200a of the first upper semiconductor substrate 200 may face the top surface of the lower semiconductor substrate 100. In other words, the first surface 200a of the first upper semiconductor substrate 200 may be closer to the lower semiconductor substrate 100 than the second surface 200b of the first upper semiconductor substrate 200.

A plurality of transistors may be disposed on the first upper semiconductor substrate 200. For example, a plurality of first upper gate structures 220 may be formed on the first surface 200a of the first upper semiconductor substrate 200. Each first upper gate structure 220 may include a first upper gate electrode 221, a first upper gate dielectric film 222, and a first upper insulation structure 225.

The first upper gate electrode 221 may be disposed on the first surface 200a of the first upper semiconductor substrate 200. In exemplary embodiments of the present inventive concept, the first upper gate electrode 221 may extend lengthwise along one direction. For example, in FIG. 1, the first upper gate electrode 221 may extend lengthwise along a direction perpendicular to the first surface 200a of the first upper semiconductor substrate 200.

The first upper gate electrode 221 may include, for example, but is not limited to, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V) or combinations thereof.

The first upper gate dielectric film 222 may be interposed between the first upper semiconductor substrate 200 and the first upper gate electrode 221. The first upper gate dielectric film 222 may include, for example, a high dielectric constant material having a dielectric constant higher than that of silicon oxide. For example, the first upper gate dielectric film 222 may include, but is not limited to, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate or combinations thereof.

The first upper insulation structure 225 may surround the side surface and bottom surface of the first upper gate electrode 221. For example, the first upper insulation structure 225 may include a first upper spacer 226 and a first upper capping pattern 227. The first upper spacer 226 may extend along the side surface of the first upper gate electrode 221, and the first upper capping pattern 227 may extend along the bottom surface of the first upper gate electrode 221. In exemplary embodiments of the present inventive concept, the first upper spacer 226 may extend along the side surface of the first upper gate electrode 221 and the side surface of the first upper capping pattern 227.

The first upper spacer 226 and the first upper capping pattern 227 may include, for example, but are not limited to, silicon nitride (SiN), silicon oxynitride (SiON), silicon oxide (SiO$_2$), oxycarbonitride (SiOCN) or combinations thereof.

In FIG. 1, although the first upper gate dielectric film 222 is illustrated as extending along the first surface 200a of the first upper semiconductor substrate 200 and the inner surface of the first upper spacer 226, this is merely an example. For example, the first upper gate dielectric film 222 may extend only along the first surface 200a of the first upper semiconductor substrate 200.

The first interlayer insulation films 140 and 240 may be interposed between the lower semiconductor substrate 100 and the first upper semiconductor substrate 200. The first interlayer insulation films 140 and 240 may include a lower interlayer insulation film 140 and an upper interlayer insulation film 240. The lower interlayer insulation film 140 may be formed on the top surface of the lower semiconductor substrate 100. The upper interlayer insulation film 240 may be formed on the first surface 200a of the first upper semiconductor substrate 200. For example, the upper interlayer insulation film 240 may be interposed between the first surface 200a of the first upper semiconductor substrate 200 and the lower interlayer insulation film 140. In exemplary embodiments of the present inventive concept, the upper interlayer insulation film 240 may cover the first upper gate structure 220.

The lower interlayer insulation film 140 and the upper interlayer insulation film 240 may include, for example, but are not limited to, silicon oxide, silicon nitride, silicon oxynitride, Flowable Oxide (FOX), Tonen SilaZene (TOSZ), Undoped Silica Glass (USG), Borosilica Glass (BSG), PhosphoSilica Glass (PSG), BomPhosphoSilica Glass (BPSG), Plasma Enhanced Tetra Ethyl Ortho Silicate (PETEOS), Fluoride Silicate Glass (FSG), Carbon Doped Silicon Oxide (CDO), Xerogel, Aerogel, Amorphous Fluorinated Carbon, Organo Silicate Glass (OSG), Parylene, bis-benzocyclobutenes (BCB), SiLK, a polyimide, a porous polymeric material, or combinations thereof.

The first upper contact 250 may be disposed on the side surface of the first upper gate structure 220. The first upper contact 250 may be formed in a first penetration hole 250h penetrating the upper interlayer insulation film 240 and the first upper semiconductor substrate 200.

At least a part of the side surface of the first upper contact 250 may be defined by the side surface of the first upper gate structure 220. For example, as illustrated in FIGS. 1 and 2, at least a part of the side surface of the first upper contact 250 may extend along the side surface of the first upper gate structure 220. In exemplary embodiments of the present inventive concept, at least a part of the side surface of the first upper contact 250 may be in contact with the side surface of the first upper gate structure 220.

In addition, the first upper contact 250 may penetrate the first upper semiconductor substrate 200 and the upper interlayer insulation film 240. In exemplary embodiments of the present inventive concept, the width of the first upper contact 250 may decrease toward the second surface 200b of the first upper semiconductor substrate 200. Here, the 'width' may mean a width in a direction parallel to the top surface of the lower semiconductor substrate 100.

The first upper contact 250 may be formed by a self-aligned contact (SAC) process performed in a direction from the first upper gate structure 220 to the first upper semiconductor substrate 200. This will be described in detail later in the description of FIGS. 21 through 26.

As illustrated in FIG. 1, the first upper contact 250 may include a first portion 250a, a second portion 250b and a third portion 250c.

The first portion 250a of the first upper contact 250 may penetrate the first upper semiconductor substrate 200. For example, the first portion 250a of the first upper contact 250 may penetrate a source/drain region of the transistor including the first upper gate structure 220. This allows the first upper contact 250 to be connected to the source/drain region of the transistor including the first upper gate structure 220.

In exemplary embodiments of the present inventive concept, the width of the first portion 250a of the first upper contact 250 may decrease toward the second surface 200b of the first upper semiconductor substrate 200. For example, a width W11 of the first upper contact 250 at the same level as the second surface 200b of the first upper semiconductor substrate 200 may be smaller than a width W12 of the first upper contact 250 at the same level as the first surface 200a of the first upper semiconductor substrate 200.

The second portion 250b of the first upper contact 250 may be disposed below the first portion 250a of the first upper contact 250. The second portion 250b of the first upper contact 250 may be connected to the first portion 250a of the first upper contact 250 in the upper interlayer insulation film 240.

In exemplary embodiments of the present inventive concept, the width of the second portion 250b of the first upper contact 250 may decrease toward the first surface 200a of the first upper semiconductor substrate 200. For example, the width W12 of the first upper contact 250 at the same level as the first surface 200a of the first upper semiconductor substrate 200 may be smaller than the width W13 of the first upper contact 250 at the same level as the bottom surface of the first upper gate structure 220.

The side surface of the second portion 250b of the first upper contact 250 may be adjacent to the side surface of the first upper gate structure 220. In exemplary embodiments of the present inventive concept, the side surface of the second portion 250b of the first upper contact 250 may be defined by the side surface of the first upper gate structure 220. For example, the side surface of the second portion 250b of the first upper contact 250 may extend along the side surface of the first upper gate structure 220. In exemplary embodiments of the present inventive concept, the side surface of the second portion 250b of the first upper contact 250 may be in contact with the outer surface of the first upper insulation structure 225. In exemplary embodiments of the present inventive concept, the side surface of the second portion 250b of the first upper contact 250 may be in contact with the outer surface of the first upper spacer 226.

In FIG. 1, although both side surfaces of the second portion 250b of the first upper contact 250 are illustrated as being defined by the side surface of the first upper gate structure 220, this is merely an example. For example, only a first side surface of the second portion 250b may be defined by the side surface of the first upper gate structure 220, and a second side surface of the second portion 250b opposite to the first side surface may be spaced apart from the first upper gate structure 220.

In exemplary embodiments of the present inventive concept, as illustrated in FIG. 2, an outer surface 225s of the first upper insulation structure 225 may include a first recess 225r. The first recess 225r may be adjacent to a bottom surface 225b of the first upper insulation structure 225 and may have a concave shape. In exemplary embodiments of the present inventive concept, the side surface of the first upper spacer 226 may include the first recess 225r.

Since the side surface of the second portion 250b of the first upper contact 250 may be defined by the side surface of the first upper insulation structure 225, a part of the second portion 250b of the first upper contact 250 may fill the first recess 225r. For example, the second portion 250b of the first upper contact 250 may include a first protrusion 250p which fills the first recess 225r. The first protrusion 250p may be adjacent to the bottom surface 225b of the first upper insulation structure 225 and may protrude toward the first upper insulation structure 225. For example, the first protrusion 250p may protrude toward the first upper spacer 226 adjacent to the first upper capping pattern 227. The first protrusion 250p may protrude towards the first upper insulation structure 225 along a direction parallel to the first surface 200a of the first upper semiconductor substrate 200.

The third portion 250c of the first upper contact 250 may be disposed below the second portion 250b of the first upper contact 250. The third portion 250c of the first upper contact 250 may be connected to the second portion 250b of the first upper contact 250 in the first interlayer insulation films 140 and 240.

The first upper contact 250 may be used to connect the first upper semiconductor substrate 200 to the lower semiconductor substrate 100. For example, a lower contact 150 and a first conductive pad 160 may be disposed on the lower semiconductor substrate 100. The lower contact 150 may be connected to various semiconductor elements (e.g., transistors, etc.) formed on the lower semiconductor substrate 100. The first conductive pad 160 may be disposed on the lower contact 150 and connected to the lower contact 150. In this case, the first upper contact 250 may be connected to the first conductive pad 160. Therefore, the lower semiconductor substrate 100 and the first upper semiconductor substrate 200 may be electrically connected to each other.

The lower contact 150 and the first conductive pad 160 may be formed, for example, in the lower interlayer insulation film 140. In exemplary embodiments of the present inventive concept, the third portion 250c of the first upper contact 250 may penetrate a part of the upper interlayer insulation film 240 and a part of the lower interlayer insulation film 140, and may be connected to the first conductive pad 160. For example, the third portion 250c of the first upper contact 250 may directly contact the first conductive pad 160. In exemplary embodiments of the present inventive concept, the bottom surface of the first conductive pad 160 may be connected to the top surface of the lower contact 150, and the top surface of the first conductive pad 160 may be connected to the bottom surface of the first upper contact 250.

In semiconductor devices that are highly integrated, a self-aligned contact (SAC) process may be used to form the contact. However, in a three-dimensionally stacked semiconductor device, if the upper contact is formed by the self-aligned contact (SAC) process performed in a direction from the first upper semiconductor substrate 200 to the first upper gate structure 220, the first upper gate electrode 221 may not be protected by the first upper insulation structure 225 when a misalignment occurs.

However, in the semiconductor device according to exemplary embodiments of the present inventive concept, the first upper contact 250 may be formed by the self-aligned contact (SAC) process performed in the direction from the first upper gate structure 220 to the first upper semiconductor substrate 200. Accordingly, the semiconductor device according to exemplary embodiments of the present inventive concept may provide the first upper contact 250 that prevents damage to the first upper gate electrode 221. Accordingly, increases in integration and reliability of the semiconductor device according to exemplary embodiments of the present inventive concept are achieved.

Figure 3:
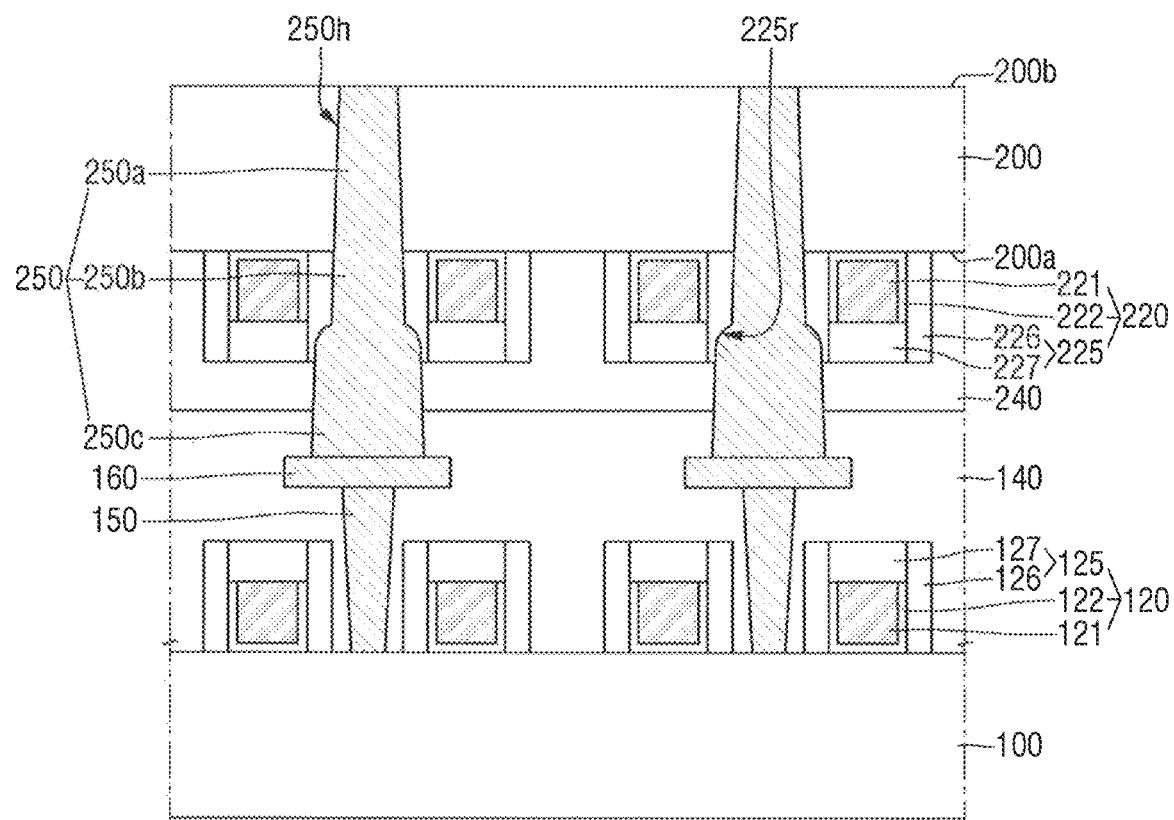
FIG. 3 is a cross-sectional view illustrating a semiconductor device according to exemplary embodiments of the present inventive concept.

FIG. 3 is a cross-sectional view illustrating a semiconductor device according to exemplary embodiments of the present inventive concept. For convenience, descriptions for elements already described with reference to FIGS. 1 and 2 may not be provided.

Referring to FIG. 3, in the semiconductor device according to exemplary embodiments of the present inventive concept, a plurality of transistors is disposed on the lower semiconductor substrate 100.

For example, a plurality of lower gate structures 120 may be formed on the lower semiconductor substrate 100. Each lower gate structure 120 may include a lower gate electrode 121, a lower gate dielectric film 122 and a lower insulation structure 125. The lower insulation structure 125 may include, for example, a lower spacer 126 and a lower capping pattern 127.

The lower gate structure 120 is illustrated as being a transistor of the same form as the first upper gate structure 220, but the present inventive concept is not limited thereto. For example, in the semiconductor device according to exemplary embodiments of the present inventive concept, the lower gate structure 120 may have a form different from the first upper gate structure 220. Since the illustrated lower gate structure 120 is similar to the first upper gate structure 220, the detailed description thereof will not be provided below.

In exemplary embodiments of the present inventive concept, the lower contact 150 may be disposed on the side surface of the lower gate structure 120. The lower contact 150 may be connected to a source/drain region of the transistor including the lower gate structure 120. Thus, the source/drain region of the first upper semiconductor substrate 200 and the source/drain region of the lower semiconductor substrate 100 may be electrically connected to each other. In other words, in exemplary embodiments of the present inventive concept, the first upper contact 250 and the lower contact 150 may function as a common source/drain contact of the first upper semiconductor substrate 200 and the lower semiconductor substrate 100.

In exemplary embodiments of the present inventive concept, the width of the lower contact 150 may decrease toward the top surface of the lower semiconductor substrate 100. This may be due to, for example, the characteristics of the etching process utilized to form the lower contact 150. For example, the lower contact 150 may be formed by the etching process of etching the lower interlayer insulation film 140 in a direction from the lower gate structure 120 to the lower semiconductor substrate 100.

Figure 4:
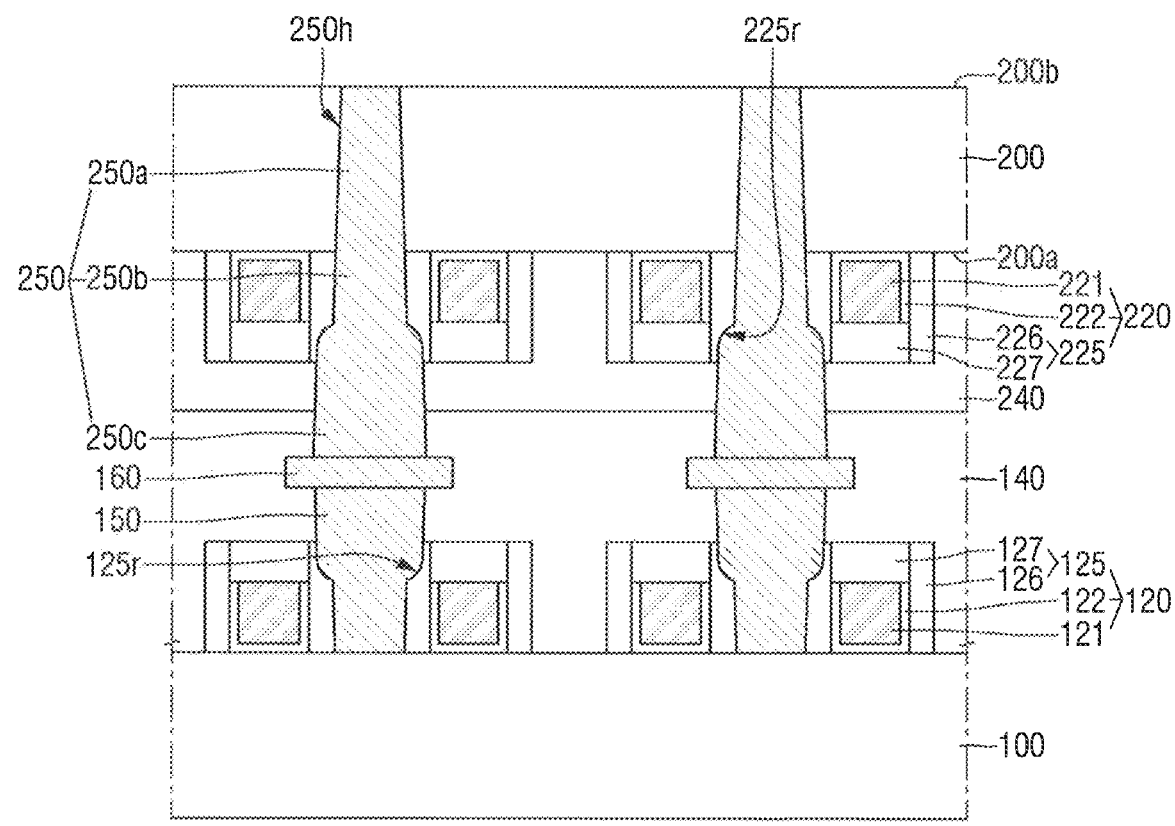
FIG. 4 is a cross-sectional view illustrating a semiconductor device according to exemplary embodiments of the present inventive concept.

FIG. 4 is a cross-sectional view illustrating a semiconductor device according to exemplary embodiments of the present inventive concept. For the convenience, descriptions for elements already described with reference to FIGS. 1 to 3 may not be provided.

Referring to FIG. 4, in the semiconductor device according to the present embodiment, at least a part of the side surface of the lower contact 150 is defined by the side surface of the lower gate structure 120.

For example, at least a part of the side surface of the lower contact 150 may extend along the side surface of the lower gate structure 120. In exemplary embodiments of the present inventive concept, a part of the side surface of the lower contact 150 may be in contact with the outer surface of the lower insulation structure 125. In exemplary embodiments of the present inventive concept, a part of the side surface of the lower contact 150 may be in contact with the outer surface of the lower spacer 126.

The lower contact 150 may be formed, for example, by a self-aligned contact (SAC) process performed in the direction from the lower gate structure 120 to the lower semiconductor substrate 100.

In exemplary embodiments of the present inventive concept, the outer surface of the lower insulation structure 125 may include a second recess 125*r*. The second recess 125*r* may be adjacent to the top surface of the lower insulation structure 125 and may have a concave shape. Since a part of the side surface of the lower contact 150 may be defined by the side surface of the lower insulation structure 125, a part of the lower contact 150 may fill the second recess 125*r*. In other words a part of the lower contact 150 may be protruded into the second recess 125*r*.

Figure 5:
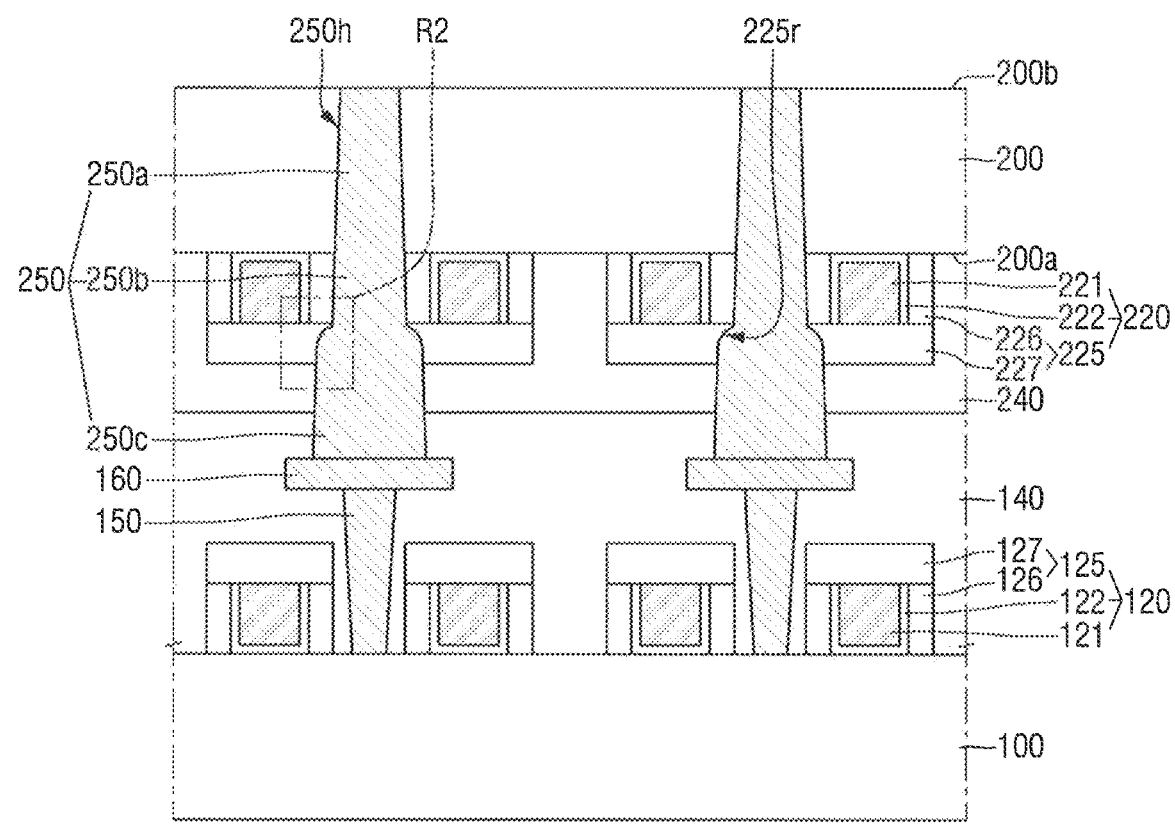
FIG. 5 is a cross-sectional view illustrating a semiconductor device according to exemplary embodiments of the present inventive concept.
Figure 6:
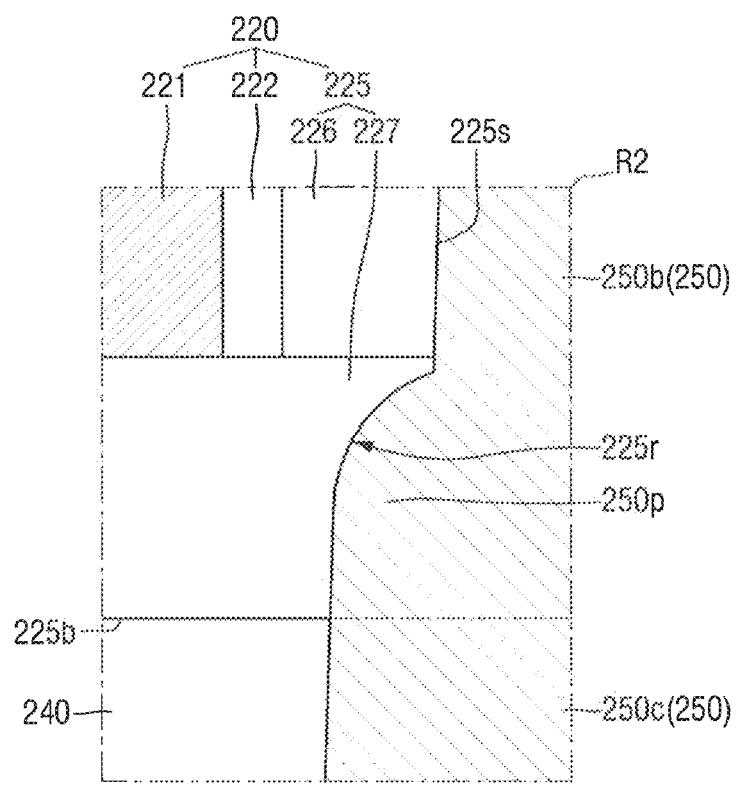
FIG. 6 is an enlarged view of a region R2 of FIG. 5.

FIG. 5 is a cross-sectional view illustrating a semiconductor device according to exemplary embodiments of the present inventive concept. FIG. 6 is an enlarged view of a region R2 of FIG. 5. For convenience, descriptions for elements already described with reference to FIGS. 1 to 3 may not be provided.

Referring to FIGS. 5 and 6, in the semiconductor device according to the present embodiment, the first upper capping pattern 227 extends along the bottom surface of the first upper gate electrode 221 and the bottom surface of the first upper spacer 226.

In exemplary embodiments of the present inventive concept, the side surface of the second portion 250*b* of the first upper contact 250 may be defined by the outer surface of the first upper spacer 226 and the outer surface of the first upper capping pattern 227.

In exemplary embodiments of the present inventive concept, the side surface of the first upper capping pattern 227 may include the first recess 225*r*. In FIGS. 5 and 6, although the first recess 225*r* is illustrated as being formed only on the side surface of the first upper capping pattern 227, this is merely an example. For example, the first recess 225*r* may be formed on the side surface the first upper capping pattern 227 and the side surface of the first upper spacer 226.

Because the side surface of the second portion 250*b* of the first upper contact 250 may be defined by the side surface of the first upper insulation structure 225, a part of the first upper contact 250 may fill the first recess 225*r*. For example, the second portion 250*b* of the first upper contact 250 may include a first protrusion 250*p* protruding toward the first upper capping pattern 227.

Figure 7:
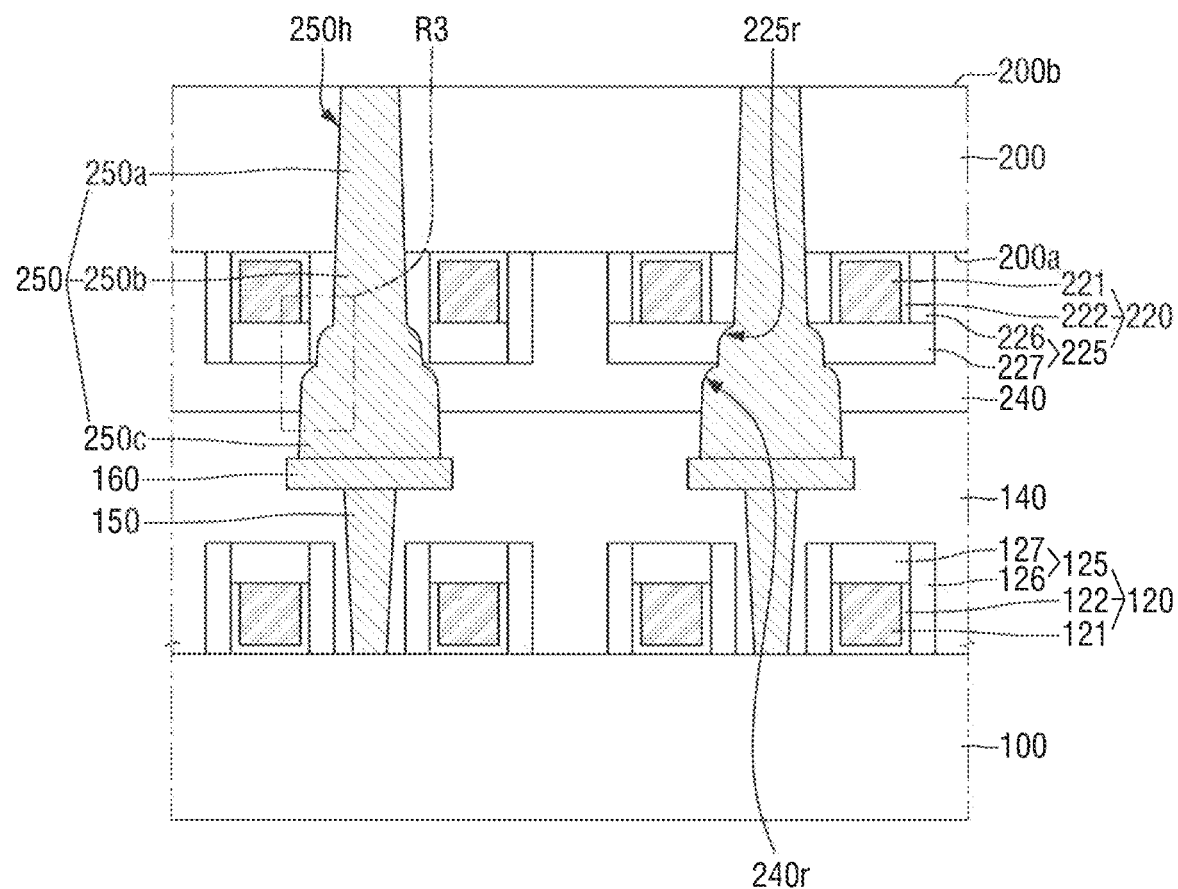
FIG. 7 is a cross-sectional view illustrating a semiconductor device according to exemplary embodiments of the present inventive concept.
Figure 8:
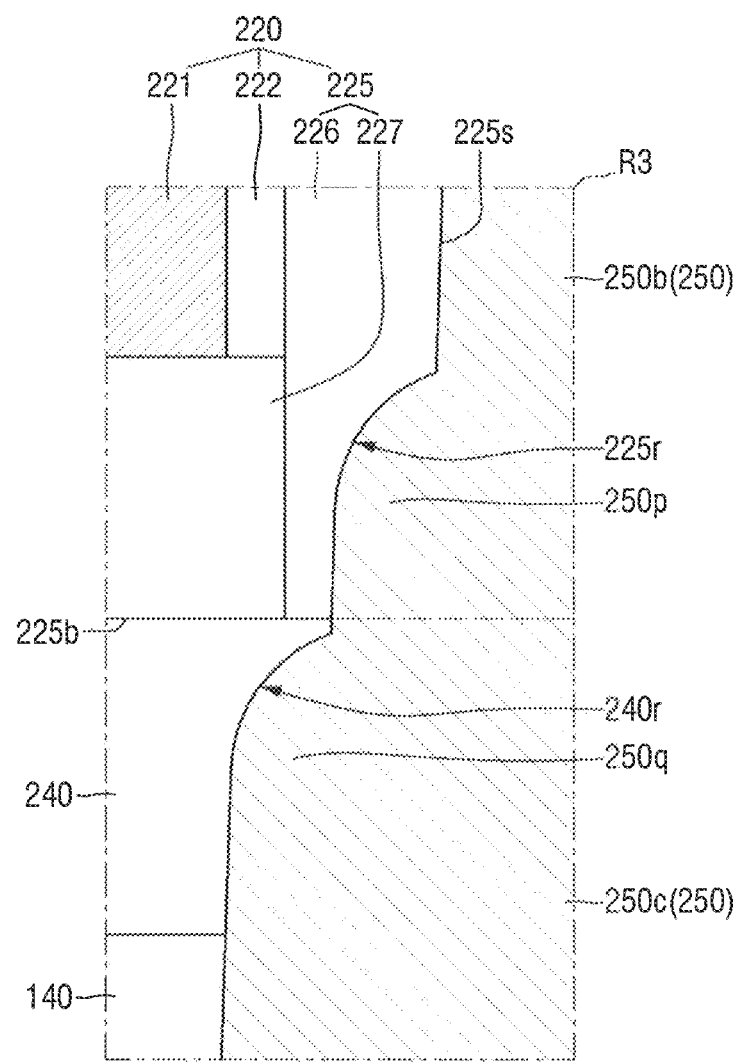
FIG. 8 is an enlarged view of a region R3 of FIG. 7.

FIG. 7 is a cross-sectional view illustrating a semiconductor device according to exemplary embodiments of the present inventive concept. FIG. 8 is an enlarged view of a region R3 of FIG. 7. For convenience, descriptions for elements already described with reference to FIGS. 1 to 3 may not be provided.

Referring to FIGS. 7 and 8, in the semiconductor device according to the present embodiment, the first interlayer insulation films 140 and 240 include a third recess 240*r*.

The third recess 240*r* may be adjacent to the bottom surface 225*b* of the first upper insulation structure 225 and may have a concave shape. In exemplary embodiments of the present inventive concept, the side surface of the upper interlayer insulation film 240 may include the third recess 240*r*.

Since the third portion 250*c* of the first upper contact 250 may be formed in the first interlayer insulation films 140 and 240, a part of the third portion 250*c* of the first upper contact 250 may fill the third recess 240*r*. For example, the third portion 250*c* of the first upper contact 250 may include a second protrusion 250*q* which fills the third recess 240*r*. The second protrusion 250*q* may be adjacent to the bottom surface 225*b* of the first upper insulation structure 225 and may protrude toward the first interlayer insulation films 140 and 240. For example, the second protrusion 250*q* may protrude toward a portion of the upper interlayer insulation film 240 adjacent to the first upper capping pattern 227.

FIGS. 9 to 13 are various cross-sectional views illustrating a semiconductor device according to exemplary embodiments of the present inventive concept. For convenience, descriptions for elements already described with reference to FIGS. 1 to 3 may not be provided.

Referring to FIGS. 9 to 13, the semiconductor device according to exemplary embodiments of the present inventive concept further includes a channel adjustment film 310.

The channel adjustment film 310 may be disposed on the second surface 200b of the first upper semiconductor substrate 200. In exemplary embodiments of the present inventive concept, the channel adjustment film 310 may be formed directly on the second surface 200b of the first upper semiconductor substrate 200. The channel adjustment film 310 may adjust the characteristics of the first upper semiconductor substrate 200. For example, the channel adjustment film 310 may adjust the channel characteristics of the transistor including the first upper gate structure 220.

Figure 9:
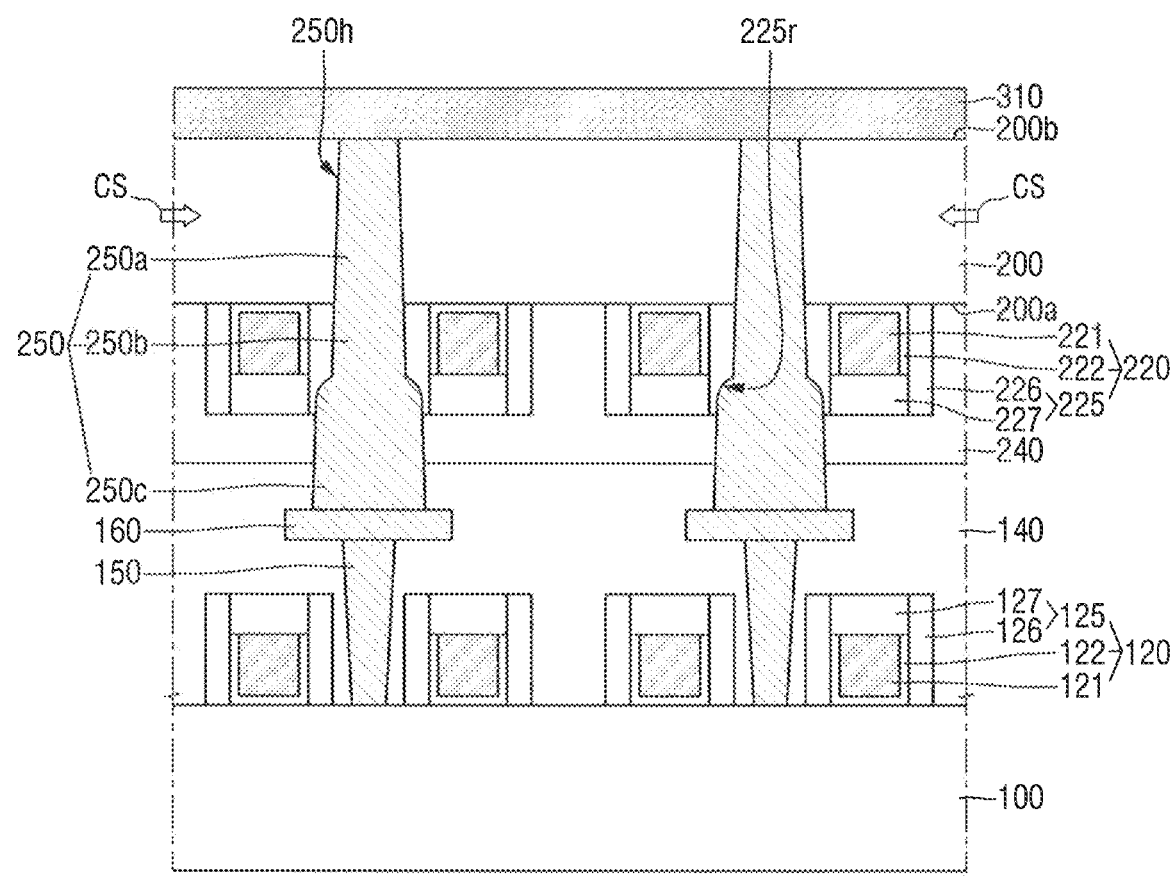
FIGS. 9, 10, 11, 12 and 13 are various cross-sectional views illustrating a semiconductor device according to exemplary embodiments of the present inventive concept.

Referring to FIG. 9, in exemplary embodiments of the present inventive concept, the channel adjustment film 310 may apply a compressive stress (CS) to the first upper semiconductor substrate 200. For example, a first lattice constant of the material included in the channel adjustment film 310 may be smaller than a second lattice constant of the material included in the first upper semiconductor substrate 200. For example, when the first upper semiconductor substrate 200 includes silicon (Si), the channel adjustment film 310 may include silicon carbide (SiC).

In a p-type metal oxide semiconductor (PMOS) transistor, the mobility of a carrier hole may be improved by applying the compressive stress to the channel. Therefore, a semiconductor device, which uses the PMOS transistor as the transistor including the first upper gate structure 220, can be provided with improved performance.

Figure 10:
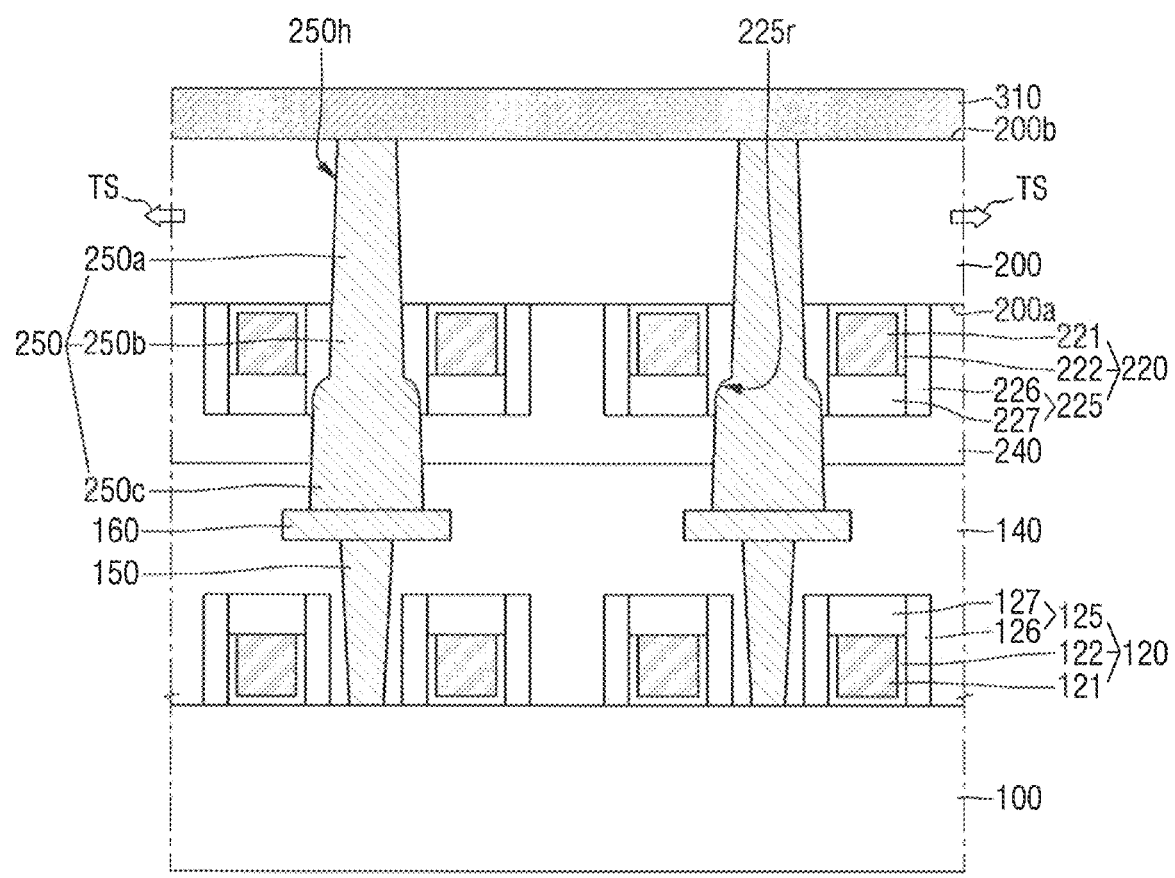

Referring to FIG. 10, in exemplary embodiments of the present inventive concept, the channel adjustment film 310 may apply tensile stress (TS) to the first upper semiconductor substrate 200. For example, the first lattice constant of the material included in the channel adjustment film 310 may be greater than the second lattice constant of the material included in the first upper semiconductor substrate 200. For example, when the first upper semiconductor substrate 200 includes silicon (Si), the channel adjustment film 310 may include silicon germanium (SiGe).

In an n-type metal oxide semiconductor (NMOS) transistor, the mobility of carriers (electrons) may be improved by applying the tensile stress to the channel. Therefore, a semiconductor device, which uses the NMOS transistor as the transistor including the first upper gate structure 220, can be provided with improved performance.

Figure 11:
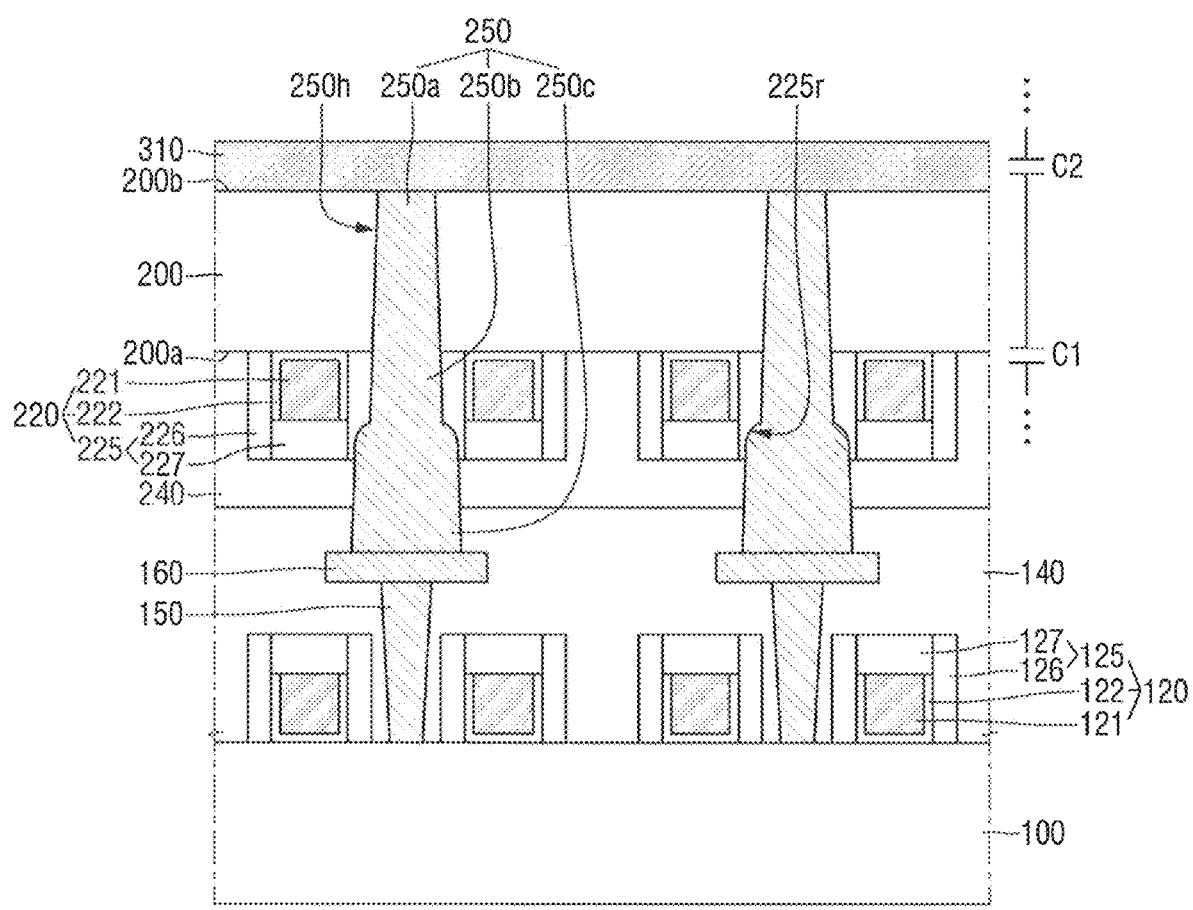

Referring to FIG. 11, in exemplary embodiments of the present inventive concept, the channel adjustment film 310 may include a ferroelectric. The channel adjustment film 310 including the ferroelectric may provide a negative capacitance component to the transistor including the first upper gate structure 220. For example, the channel adjustment film 310 including the ferroelectric may provide a negative capacitance (C2<0) to the first upper gate structure 220 having a positive capacitance (C1>0). This may further amplify the voltage to be applied to the first upper semiconductor substrate 200 (or the channel of the transistor including the first upper gate structure 220) by the first upper gate electrode 221.

As a result, in the semiconductor device according to exemplary embodiments of the present inventive concept, a Negative Capacitance FET (NCFET) having a subthreshold slope (SS) value of about 60 mV/decade or less at a normal temperature may be implemented.

Figure 12:
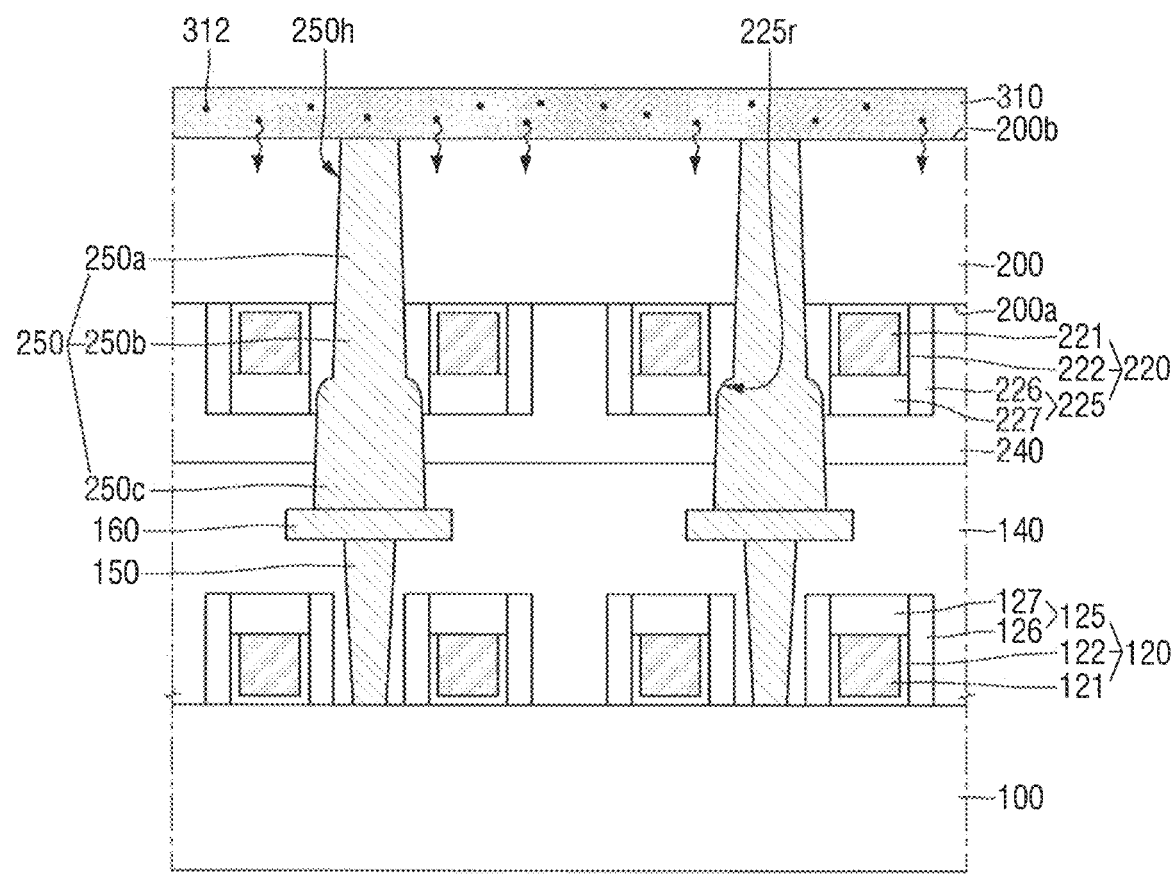

Referring to FIG. 12, in exemplary embodiments of the present inventive concept, the Channel adjustment film 310 may include impurities 312. The impurities 312 of the channel adjustment film 310 may be diffused into the first upper semiconductor substrate 200. For example, the channel adjustment film 310 may include borophosphosilicate glass (BPSG). In such a case, the impurities 312 diffused to the first upper semiconductor substrate 200 may be boron (B) or phosphorus (P).

The impurities 312 diffused into the first upper semiconductor substrate 200 may adjust the threshold voltage of the transistor including the first upper gate structure 220. Therefore, a semiconductor device, which includes the transistor including the first upper gate structure 220, can be provided with improved performance.

Figure 13:
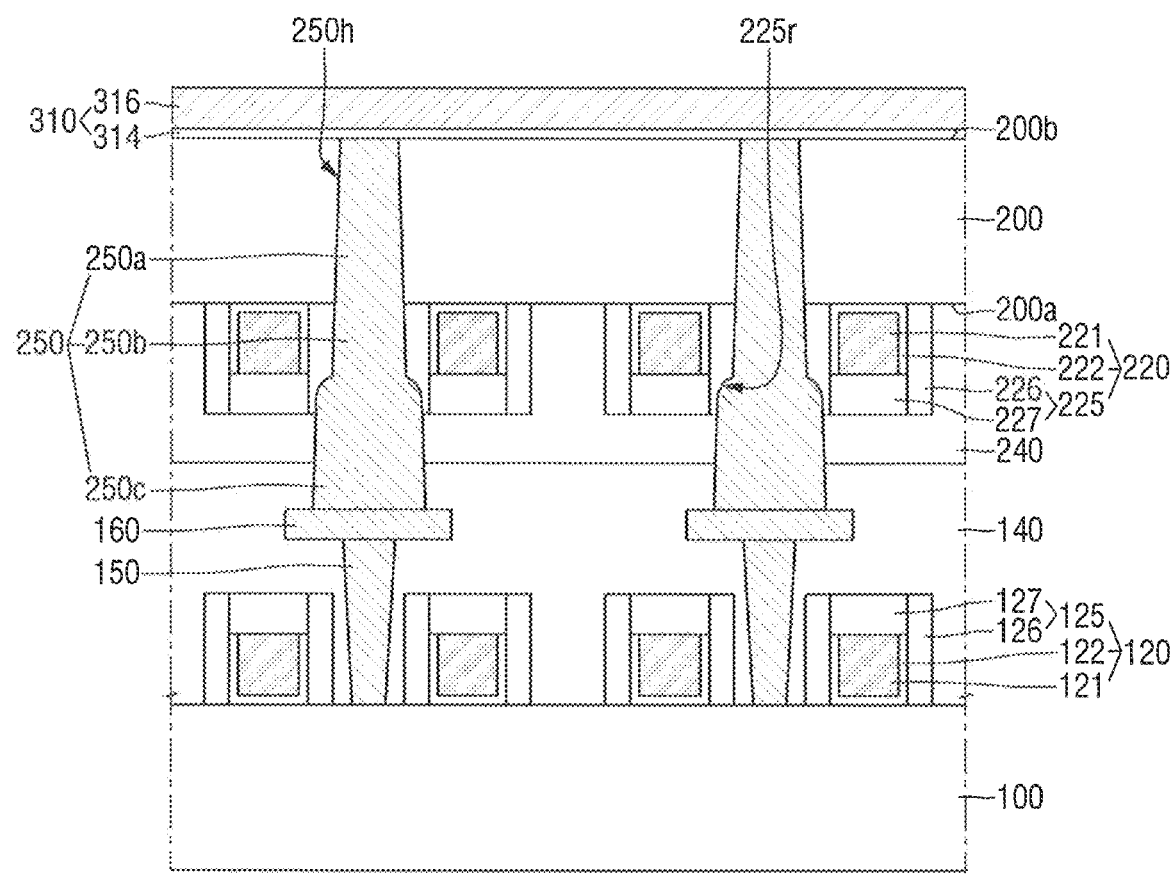

Referring to FIG. 13, in exemplary embodiments of the present inventive concept, the channel adjustment film 310 may include a dielectric film 314 and a work function metal film 316. The dielectric film 314 and the work function metal film 316 may be sequentially stacked on the second surface 200b of the first upper semiconductor substrate 200.

The dielectric film 314 may include, for example, but is not limited to, silicon oxide, silicon nitride, silicon oxynitride, a high dielectric constant material having a dielectric constant higher than silicon oxide, or a combination thereof.

The work function metal film 316 may include, for example, but is not limited to, TiN, TaN, TiC, TaC, TiAlC, or a combination thereof.

The channel adjustment film 310 including the work function metal film 316 may adjust the threshold voltage of the transistor including the first upper gate structure 220. For example, a voltage may be applied to the work function metal film 316 to adjust the threshold voltage of the transistor including the first upper gate structure 220. Therefore, a semiconductor device, which includes the transistor including the first upper gate structure 220, can be provided with improved performance.

Figure 14:
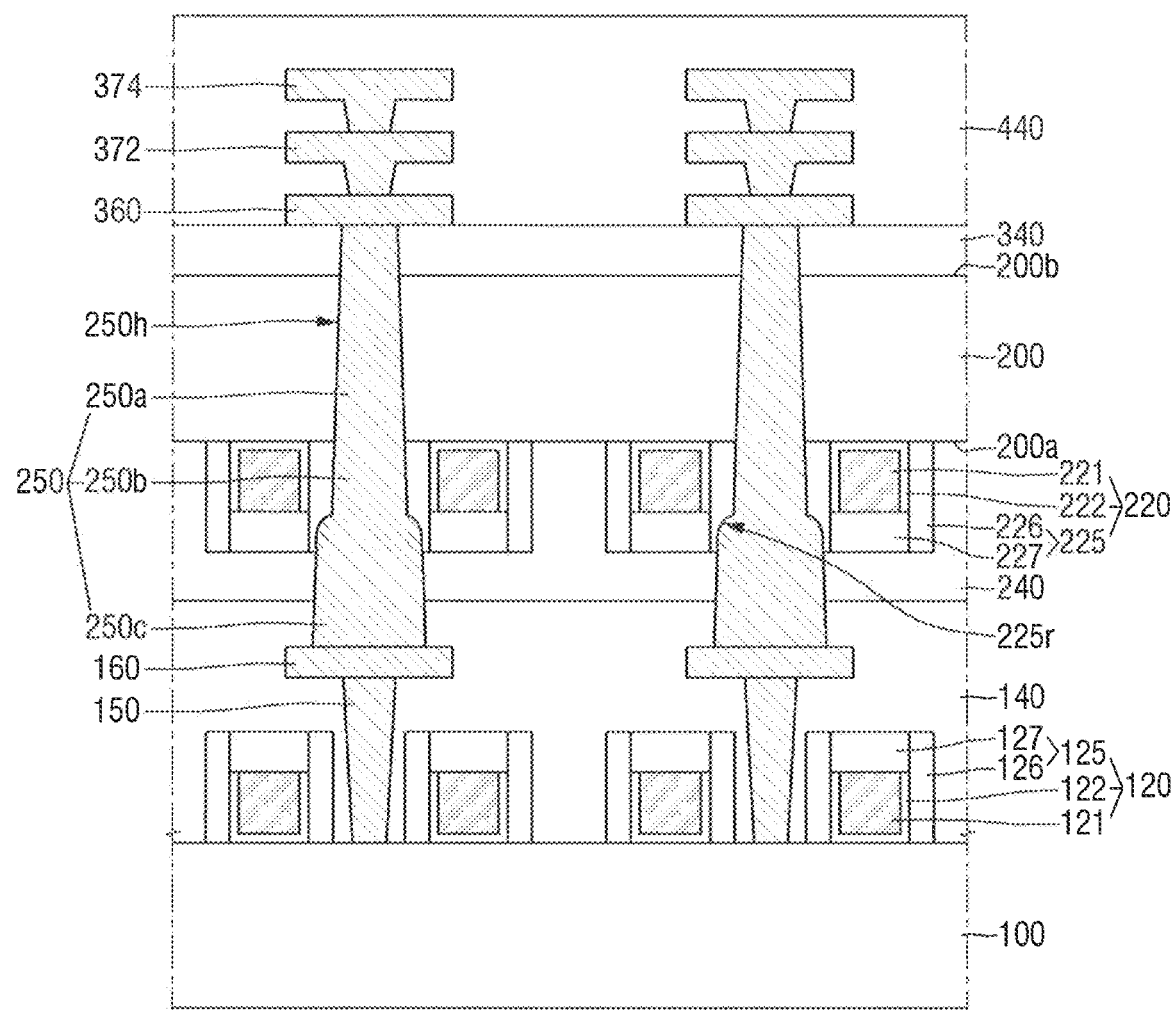
FIG. 14 is a cross-sectional view illustrating a semiconductor device according to exemplary embodiments of the present inventive concept.

FIG. 14 is a cross-sectional view illustrating a semiconductor device according to exemplary embodiments of the present inventive concept. For convenience, descriptions for elements already described with reference to FIGS. 1 to 3 may not be provided.

Referring to FIG. 14, a semiconductor device according to exemplary embodiments of the present inventive concept further includes a second interlayer insulation film 340.

The second interlayer insulation film 340 may be disposed on the second surface 200b of the first upper semiconductor substrate 200. In exemplary embodiments of the present inventive concept, the first upper contact 250 may penetrate the second interlayer insulation film 340. For example, the first portion 250a of the first upper contact 250 may penetrate the second interlayer insulation film 340 beyond the first upper semiconductor substrate 200.

Thus, in the semiconductor device according to the present embodiment, the transistor formed on the first upper semiconductor substrate 200 may be connected to an integrated circuit formed on the second surface 200b of the first upper semiconductor substrate 200. For example, a second conductive pad 360 and wirings 372 and 374 may be disposed on the second interlayer insulation film 340. The second conductive pad 360 and the wirings 372 and 374 may be formed, for example, in a third interlayer insulation film 440 disposed on the second interlayer insulation film 340.

The second conductive pad 360 may be disposed on the first upper contact 250 and connected to the first upper contact 250. For example, the second conductive pad 360 may be directly connected to the first upper contact 250. The wirings 372 and 374 may be connected to the first upper contact 250 through the second conductive pad 360. Therefore, the first upper semiconductor substrate 200 and the wirings 372 and 374 may be electrically connected to each other.

Figure 15:
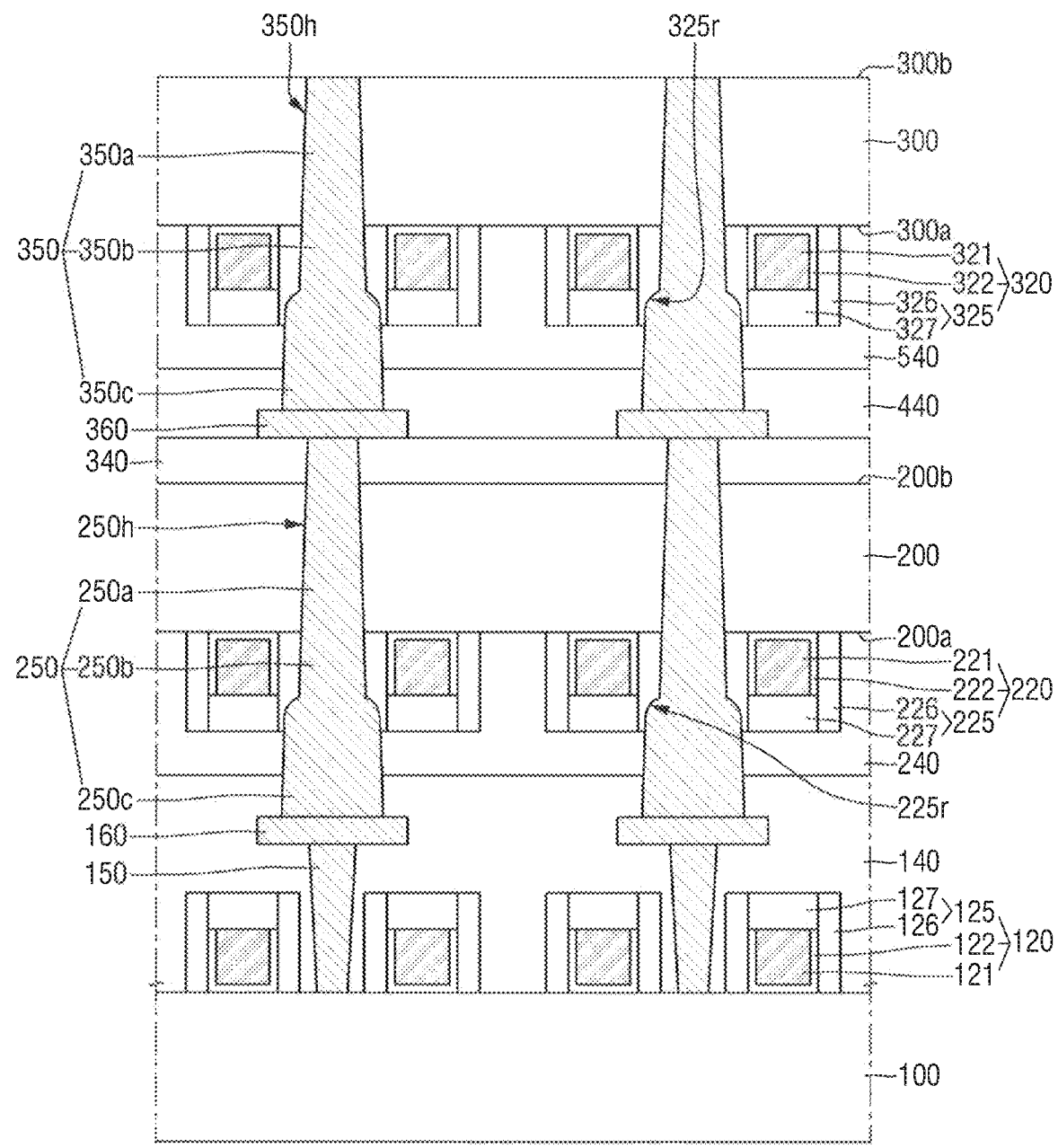
FIG. 15 is a cross-sectional view illustrating a semiconductor device according to exemplary embodiments of the present inventive concept.

FIG. 15 is a cross-sectional view illustrating a semiconductor device according to exemplary embodiments of the present inventive concept. For convenience, descriptions for elements already described with reference to FIGS. 1 to 3 and 14 may not be provided.

Referring to FIG. 15, the semiconductor device according to the present embodiment further includes a second upper semiconductor substrate 300, a second upper gate structure 320, a fourth interlayer insulation film 540, and a second upper contact 350.

The second upper semiconductor substrate 300 may include a third surface 300a and a fourth surface 300b opposite to each other. The third surface 300a of the second upper semiconductor substrate 300 may face the second surface 200b of the first upper semiconductor substrate 200. For example, the third surface 300a of the second upper semiconductor substrate 300 may be closer to the first upper semiconductor substrate 200 than the fourth surface 300b of the second upper semiconductor substrate 300.

A plurality of transistors may be disposed on the second upper semiconductor substrate 300. For example, a plurality of second upper gate structures 320 may be formed on the second upper semiconductor substrate 300. Each second upper gate structure 320 may include a second upper gate electrode 321, a second upper gate dielectric film 322, and a second upper insulation structure 325. The second upper insulation structure 325 may include, for example, a second upper spacer 326 and a second upper capping pattern 327.

The second upper gate structure 320 is illustrated as being a transistor of the same form as the first upper gate structure 220, but the present inventive concept is not limited thereto. For example, in the semiconductor device according to the present embodiment, the second upper gate structure 320 may have a form different from the first upper gate structure 220. Since the illustrated second upper gate structure 320 is similar to the first upper gate structure 220, a detailed description thereof will not be provided below.

The second upper contact 350 may be disposed on the side surface of the second upper gate structure 320. The second upper contact 350 may be formed in a second penetration hole 350h penetrating the fourth interlayer insulation film 540 and the second upper semiconductor substrate 300. The second upper contact 350 may include a fourth portion 350a, a fifth portion 350b and a sixth portion 350c. In exemplary embodiments of the present inventive concept, a part of the second upper contact 350 may fill a fourth recess 325r of the second upper insulation structure 325. Since the second upper contact 350 is similar to the first upper contact 250, a detailed description thereof will not be provided below.

The second upper contact 350 may be used to connect the second upper semiconductor substrate 300 to the first upper semiconductor substrate 200. For example, the second upper contact 350 may be connected to the second conductive pad 360. For example, the second upper contact 350 may be directly connected to the second conductive pad 360. Thus, the lower semiconductor substrate 100, the first upper semiconductor substrate 200, and the second upper semiconductor substrate 300 may be electrically connected to each other.

Figure 16:
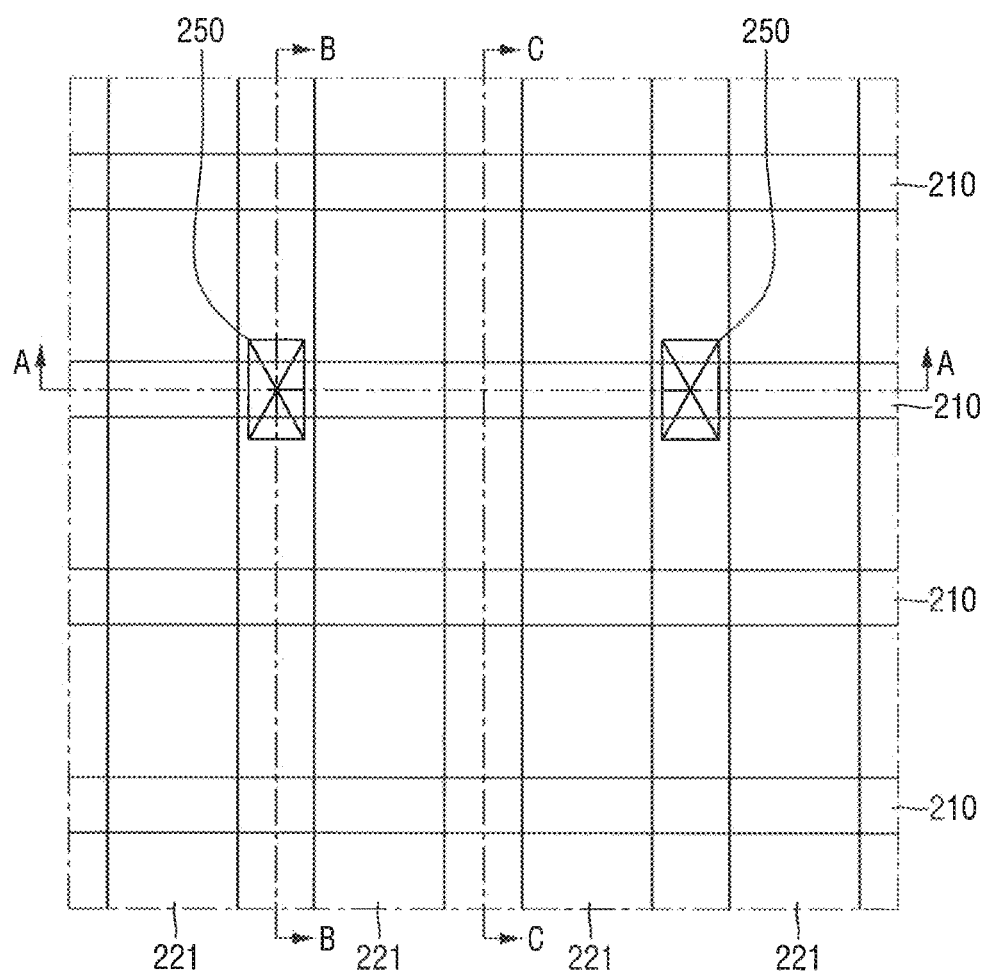
FIG. 16 is a layout diagram illustrating a semiconductor device according to exemplary embodiments of the present inventive concept.
Figure 17:
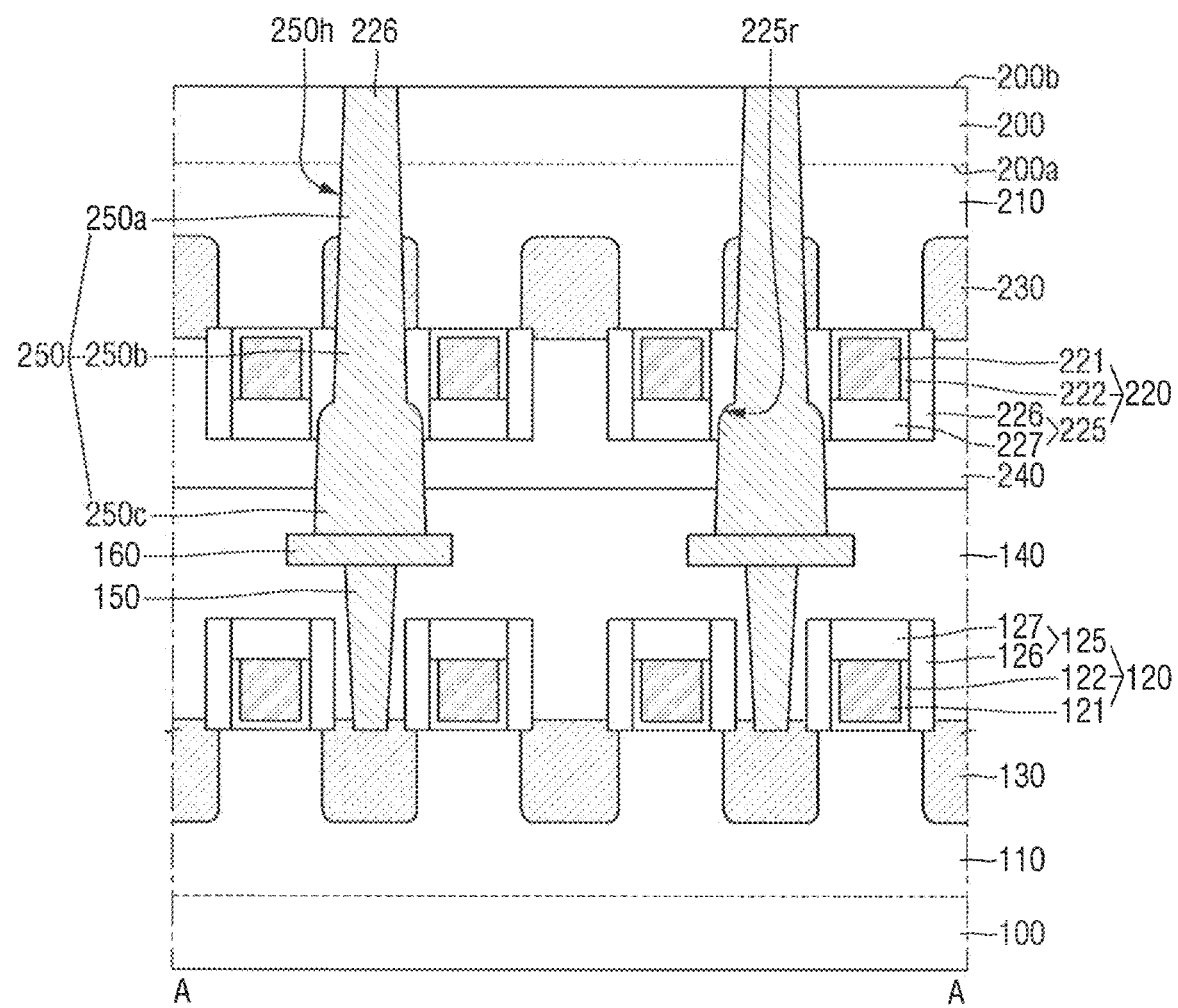
FIG. 17 is a cross-sectional view taken along line A-A of FIG. 16.
Figure 18:
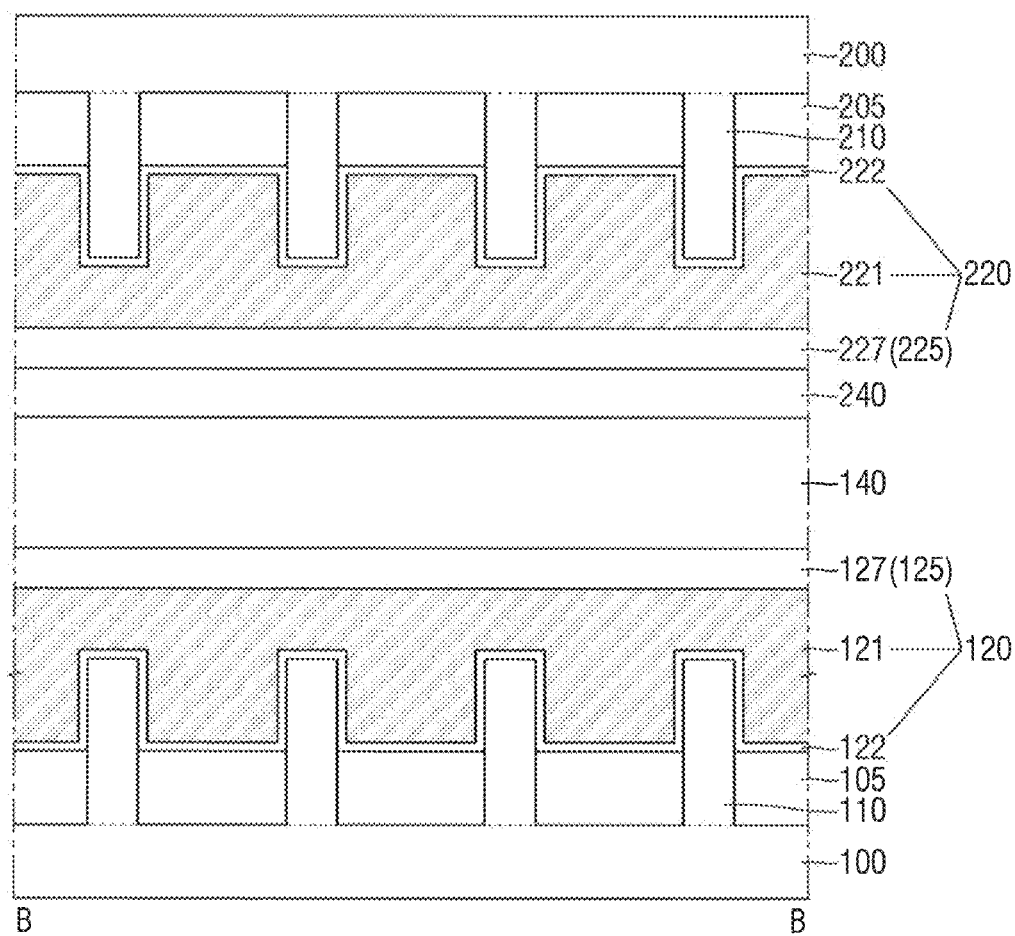
FIG. 18 is a cross-sectional view taken along line B-B of FIG. 16.
Figure 19:
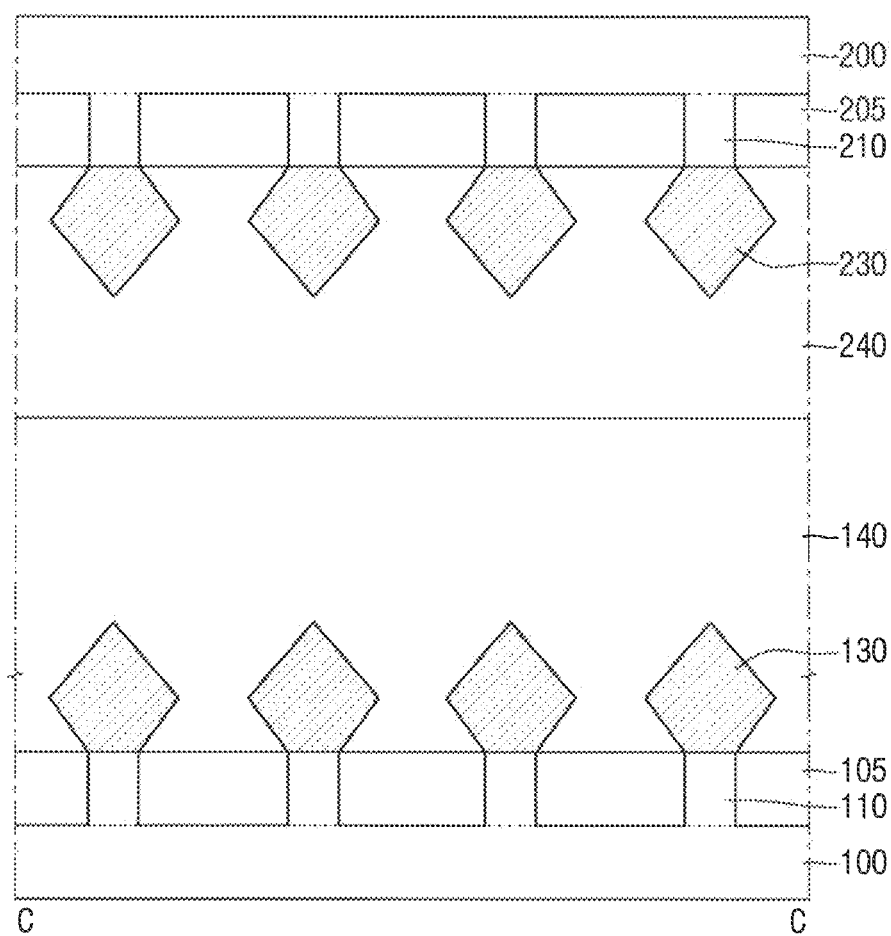
FIG. 19 is a cross-sectional view taken along line C-C of FIG. 16.

FIG. 16 is a layout diagram illustrating a semiconductor device according to exemplary embodiments of the present inventive concept. FIG. 17 is a cross-sectional view taken along line A-A of FIG. 16. FIG. 18 is a cross-sectional view taken along line B-B of FIG. 16. FIG. 19 is a cross-sectional view taken along line C-C of FIG. 16. For convenience, descriptions for elements already described with reference to FIGS. 1 to 3 may not be provided.

Referring to FIGS. 16 through 19, the semiconductor device according to the present embodiment includes a fin-type transistor.

For example, the semiconductor device according to the present embodiment may further include an upper active pattern 210, an upper field insulation film 205, and an upper source/drain region 230.

The upper active pattern 210 may protrude from the first upper semiconductor substrate 200 and may extend lengthwise in one direction. In exemplary embodiments of the present inventive concept, the upper active pattern 210 may protrude from the first surface 200a of the first upper semiconductor substrate 200. In other words, the upper active pattern 210 may protrude in a direction toward the lower semiconductor substrate 100.

The upper active pattern 210 may extend in a direction intersecting the first upper gate structure 220. For example, as illustrated in FIG. 16, the upper active pattern 210 may extend lengthwise along the first direction, and the first upper gate structure 220 may extend lengthwise along the second direction intersecting the first direction.

The upper active pattern 210 may include silicon or germanium, which is an elemental semiconductor material. In addition, the upper active pattern 210 may include a compound semiconductor, for example, a group IV-IV compound semiconductor or a group III-V compound semiconductor. The group IV-IV compound semiconductor may be, for example, a binary compound or a ternary compound including at least two or more of carbon (C), silicon (Si), germanium (Ge) and tin (Sn), or a compound obtained by doping these elements with a group IV element. The group compound semiconductor may be, for example, one of a binary compound, a ternary compound or a quaternary compound formed by combining at least one of aluminum (Al), gallium (Ga) and indium (In) as a group III element with one of phosphorus (P), arsenic (As) and ammonium (Sb) as a group V element.

The upper field insulation film 205 may be formed on the first surface 200a of the first upper semiconductor substrate 200. As illustrated in FIGS. 18 and 19, the upper field insulation film 205 may cover a part of the side walls of the upper active pattern 210.

The upper field insulation film 205 may include, for example, but is not limited to, at least one of silicon oxide, silicon nitride, silicon oxynitride, and combinations thereof.

The upper source/drain region 230 may be formed in the upper active pattern 210 on the side surface of the first upper gate structure 220. However, the upper source/drain region 230 may be insulated from the first upper gate structure 220. For example, the upper source/drain region 230 may be spaced apart from the first upper gate electrode 221 by the first upper spacer 226. The upper source/drain region 230 may contact the first upper spacer 226. The upper source/drain region 230 may function as the source/drain of the transistor including the first upper gate structure 220.

The upper source/drain region 230 may include an epitaxial layer formed in the upper active pattern 210. As illustrated in FIG. 17, the upper source/drain region 230 may be a raised source/drain region protruding from the upper active pattern 210. In addition, the upper source/drain region 230 may include an undercut that overlaps the first upper spacer 226. However, this is only an example, and the present inventive concept is not limited thereto. For example, the upper source/drain region 230 may be an impurity region formed in the upper active pattern 210.

When the semiconductor device according to the present embodiment is a PMOS transistor, the upper source/drain region 230 may include a p-type impurity or an impurity for preventing the diffusion of the p-type impurity. For example, the upper source/drain region 230 may include at least one of B, C, In, Ga, and Al or a combination thereof.

In addition, when the semiconductor device according to the present embodiment is a PMOS transistor, the upper source/drain region 230 may include a compressive stress material. For example, when the upper active pattern 210 is Si, the upper source/drain region 230 may include a material having a larger lattice constant than Si, for example, SiGe. The compressive stress material may apply a compressive stress to the upper active pattern 210 to improve mobility of carriers of the channel region of the PMOS transistor.

When the semiconductor device according to the present embodiment is an NMOS transistor, the upper source/drain region 230 may include an n-type impurity or an impurity for preventing the diffusion of the n-type impurity. For example, the upper source/drain region 230 may include at least one of P, Sb, and As or a combination thereof.

In addition, when the semiconductor device according to the present embodiment is an NMOS transistor, the upper source/drain region 230 may include a tensile stress material. For example, when the upper active pattern 210 is Si, the upper source/drain region 230 may include a material having a smaller lattice constant than Si, for example, SiC. The tensile stress material may apply a tensile stress to the upper active pattern 210 to improve the mobility of carriers of the channel region of the NMOS transistor.

Although the upper source/drain region 230 is illustrated as being a single film, the present inventive concept is not limited thereto. For example, each upper source/drain region 230 may be formed of multiple films containing different concentrations of impurities.

In FIG. 19, the cross section of the upper source/drain region 230 is illustrated as being a pentagonal shape, but this is merely an example. For example, the cross section of the upper source/drain region 230 may have various shapes, such as a diamond shape or a hexagonal shape.

The semiconductor device according to the present embodiment may further include a lower active pattern 110, a lower field insulation film 105, and a lower source/drain region 130. Since the illustrated lower active pattern 110, the lower field insulation film 105, and the lower source/drain region 130 are similar to each of the upper active pattern 210, the upper field insulation film 205, and the upper source/drain region 230, a detailed description thereof will not be provided below.

In exemplary embodiments of the present inventive concept, the first upper contact 250 may penetrate the upper source/drain region 230. For example, the first portion 250a of the first upper contact 250 may penetrate the upper source/drain region 230. Therefore, the first upper contact 250 may be connected to the upper source/drain region 230.

In exemplary embodiments of the present inventive concept, the lower contact 150 may be connected to the lower source/drain region 130. For example, the lower contact 150 may penetrate the lower source/drain region 130. Therefore, the lower source/drain region 130 and the upper source/drain region 230 may be electrically connected to each other. In other words, in exemplary embodiments of the present inventive concept, the first upper contact 250 and the lower contact 150 function as a common source/drain contact of the upper source/drain region 230 and the lower source/drain region 130.

Figure 20:
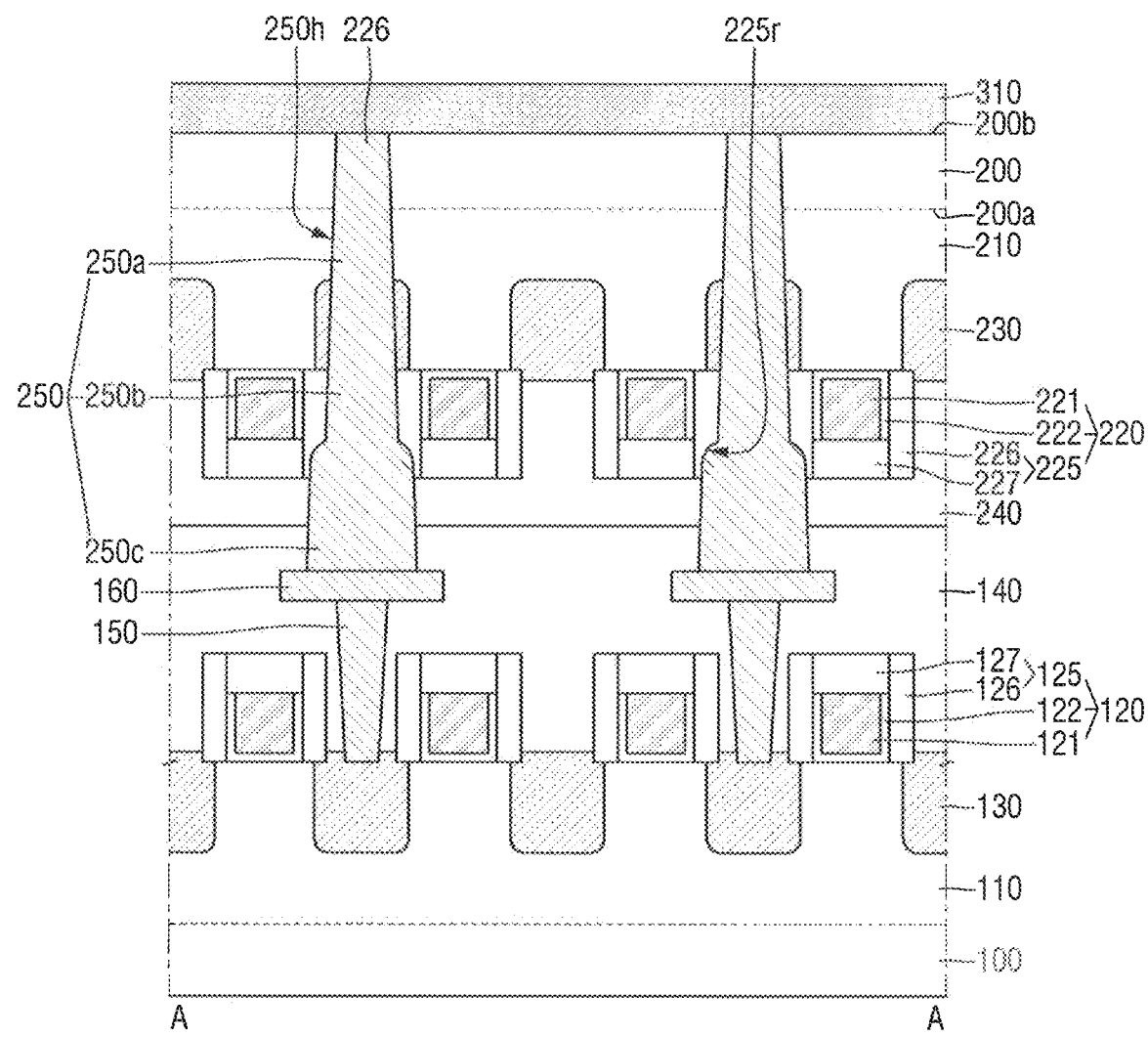
FIG. 20 is a cross-sectional view illustrating a semiconductor device according to exemplary embodiments of the present inventive concept.

FIG. 20 is a cross-sectional view illustrating a semiconductor device according to exemplary embodiments of the present inventive concept. For convenience, descriptions for elements already described with reference to FIGS. 1 to 3, 9 to 13, and 17 to 19 may not be provided.

Referring to FIG. 20, the semiconductor device according to the present embodiment further includes a channel adjustment film 310.

The channel adjustment film 310 may be disposed on the second surface 200b of the first upper semiconductor substrate 200. In exemplary embodiments of the present inventive concept, the channel adjustment film 310 may be formed directly on the second surface 200b of the first upper semiconductor substrate 200. The channel adjustment film 310 may adjust the characteristics of the first upper semiconductor substrate 200. Accordingly, the channel adjustment film 310 may adjust channel characteristics of the transistor including the first upper gate structure 220.

In exemplary embodiments of the present inventive concept, the channel adjustment film 310 may apply a compressive stress or a tensile stress to the first upper semiconductor substrate 200.

In exemplary embodiments of the present inventive concept, the channel adjustment film 310 may include a ferroelectric. The channel adjustment film 310 including the ferroelectric may provide a negative capacitance component to the transistor including the first upper gate structure 220.

In exemplary embodiments of the present inventive concept, the channel adjustment film 310 may include impurities diffused into the first upper semiconductor substrate 200. For example, the channel adjustment film 310 may include borophosphosilicate glass (BPSG).

In exemplary embodiments of the present inventive concept, the channel adjustment film 310 may include an insulation film and a work function metal film sequentially stacked on the second surface 200b of the first upper semiconductor substrate 200.

Hereinafter, a method for fabricating a semiconductor device according to exemplary embodiments of the present inventive concept will be described with reference to FIGS. 1 through 31.

FIGS. 21 to 26 are intermediate stage diagrams illustrating the method for fabricating the semiconductor device according to exemplary embodiments of the present inventive concept. For convenience, descriptions for elements already described with reference to FIGS. 1 to 20 may not be provided.

Figure 21:
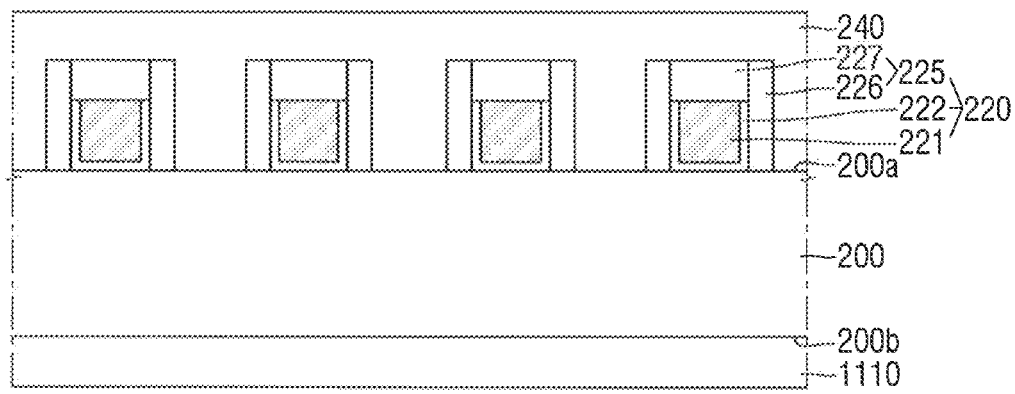
FIGS. 21, 22, 23, 24, 25 and 26 are intermediate stage diagrams illustrating a method for fabricating a semiconductor device according to exemplary embodiments of the present inventive concept.

Referring to FIG. 21, a first upper semiconductor substrate 200, a first upper gate structure 220, and an upper interlayer insulation film 240 may be formed on a sacrificial film 1110.

The first upper semiconductor substrate 200 may be formed such that the second surface 200b of the first upper semiconductor substrate 200 faces the sacrificial film 1110. The first upper gate electrode 221 and the upper interlayer insulation film 240 may be formed on the first surface 200a of the first upper semiconductor substrate 200. The upper interlayer insulation film 240 may cover the first upper gate electrode 221.

Figure 22:
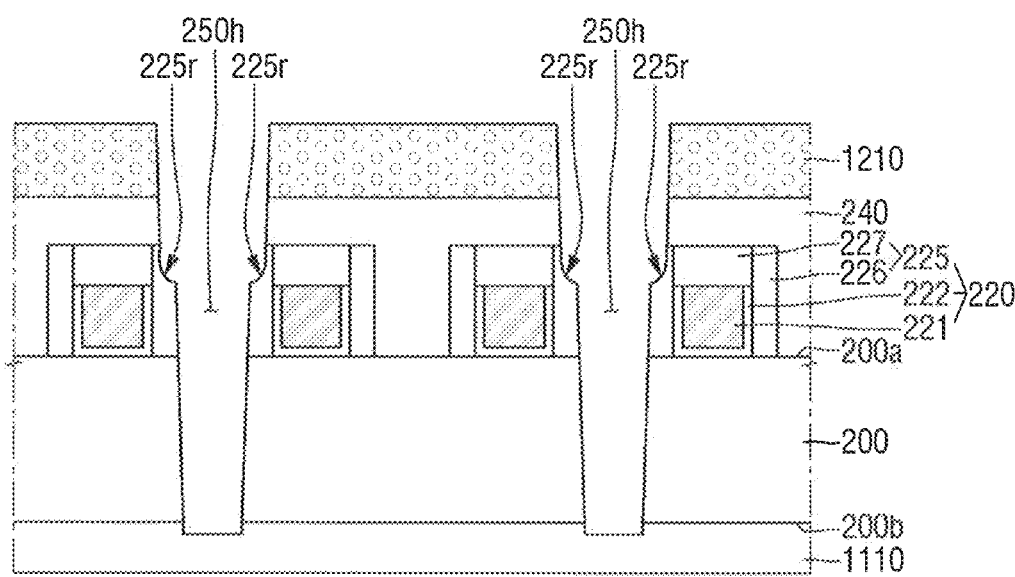

Referring to FIG. 22, a first penetration hole 250h penetrating the upper interlayer insulation film 240 and the first upper semiconductor substrate 200 is formed.

For example, a mask pattern 1210 may be formed on the upper interlayer insulation film 240. Subsequently, an etching process using the mask pattern 1210 as an etching mask may be performed.

The first penetration holes 250h may be formed by the self-aligned contact (SAC) process. Therefore, at least a part of the side surface of the first penetration hole 250h may be defined by the side surface of the first upper gate structure 220. In addition, since the self-aligned contact (SAC) process is performed in the direction from the first upper gate structure 220 to the first upper semiconductor substrate 200, the width of the first penetration hole 250h may decrease toward the sacrificial film 1110.

Although both side surfaces of the first penetration hole 250h are illustrated as being defined by the side surface of the first upper gate structure 220, this is merely an example. For example, only a first side surface of the first penetration hole 250h may be defined by the side surface of the first upper gate structure 220, and a second side surface of the first penetration hole 250h opposite to the first side surface may be spaced apart from the first upper gate structure 220.

In exemplary embodiments of the present inventive concept, the outer surface of the first upper insulation structure 225 may include a first recess 225r formed by the self-aligned contact (SAC) process. This may be due to, for example, a difference between the first upper insulation structure 225 and the upper interlayer insulation film 240. The first recess 225r may be adjacent to the bottom surface of the first upper insulation structure 225 and may have a concave shape.

Figure 23:
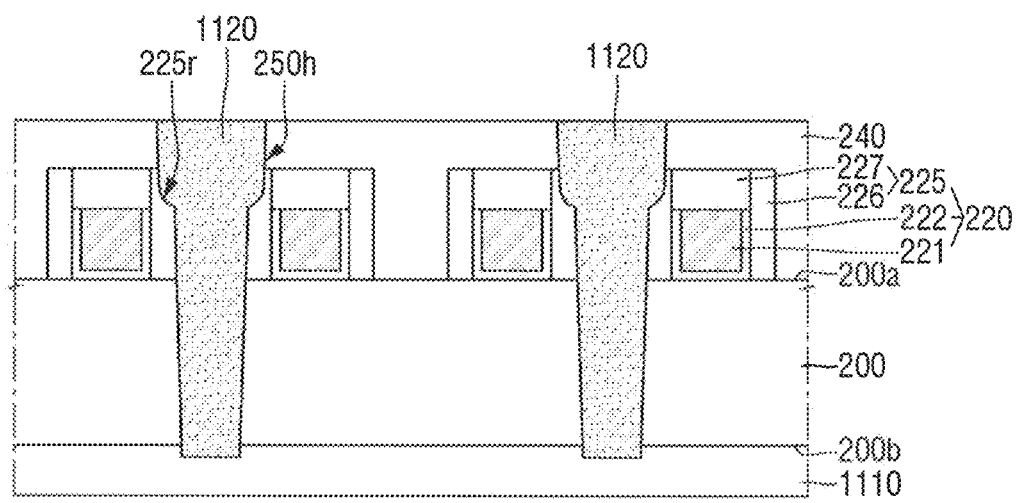

Referring to FIG. 23, dummy contacts 1120 are formed in the first penetration holes 250h.

Therefore, the dummy contacts 1120 may be disposed on the side surface of the first upper gate structure 220. In addition, at least a part of the side surface of the dummy contact 1120 may be defined by the side surface of the first upper gate structure 220. In addition, the dummy contact 1120 may penetrate the first upper semiconductor substrate 200 and the upper interlayer insulation film 240. In exemplary embodiments of the present inventive concept, the width of the dummy contact 1120 may decrease toward the sacrificial film 1110.

In exemplary embodiments of the present inventive concept, the dummy contact 1120 may include a material having an etch selectivity with the first upper semiconductor substrate 200, the upper interlayer insulation film 240 and the first upper insulation structure 225. In addition, in exemplary embodiments of the present inventive concept, the dummy contact 1120 may include a material having excellent adhesive force with a lower interlayer insulation film 140 to be described later. For example, the dummy contact 1120 may include, but is not limited to, polysilicon (poly Si).

Figure 24:
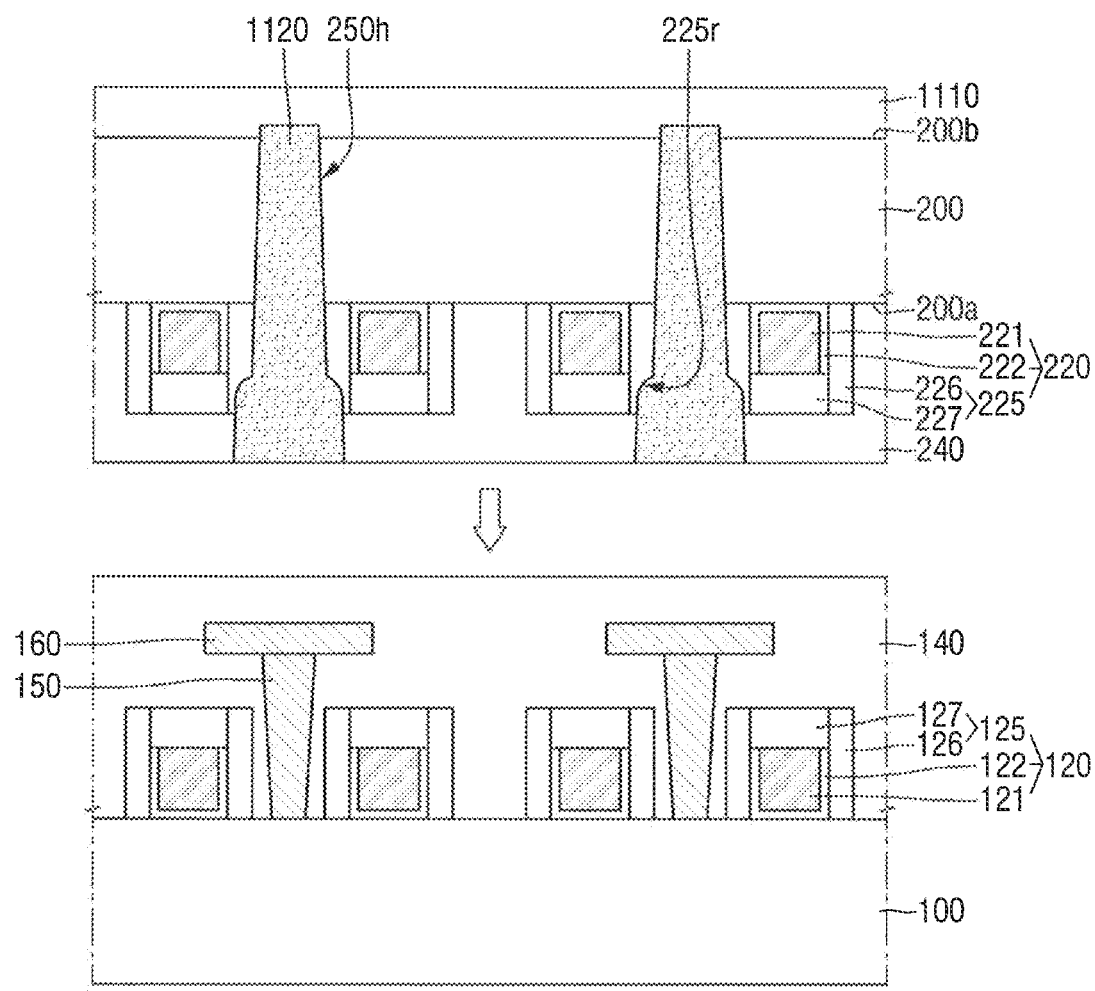

Referring to FIG. 24, the upper interlayer insulation film 240 is coupled onto the lower interlayer insulation film 140.

For example, the lower semiconductor substrate 100, the lower gate structure 120, and the lower interlayer insulation film 140 may be provided. Subsequently, the lower interlayer insulation film 140 and the upper interlayer insulation film 240 may be coupled such that the first surface 200a of the first upper semiconductor substrate 200 faces the top surface of the lower semiconductor substrate 100.

In general, when an upper semiconductor substrate is three-dimensionally stacked on a lower semiconductor substrate, the upper contact including metal has a weak coupling force with the lower interlayer insulation film, and thus, the upper contact is not easily stacked. However, in the method for fabricating the semiconductor device according to exemplary embodiments of the present inventive concept, since the dummy contact 1120 may include a material having excellent adhesive force with the lower interlayer insulation film 140, the lower interlayer insulation film 140 and the upper interlayer insulation film 240 may be more strongly coupled.

Figure 25:
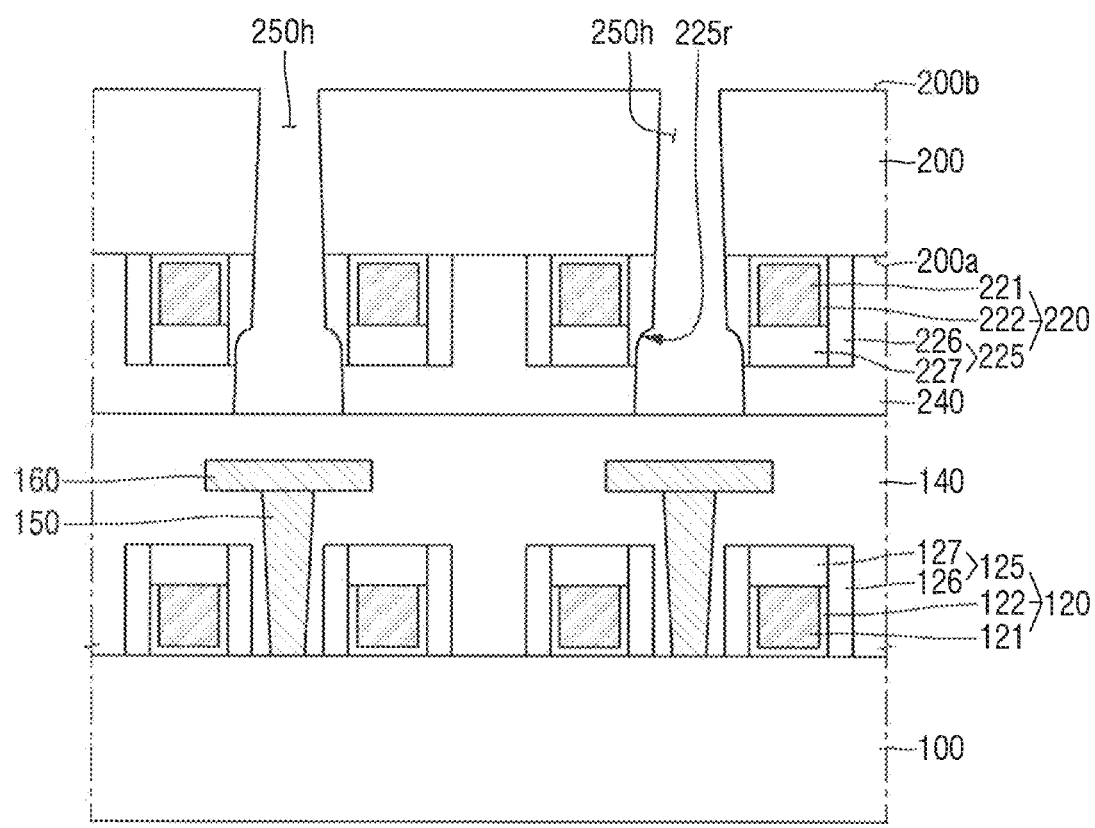

Referring to FIG. 25, the dummy contact 1120 is removed.

For example, the sacrificial film 1110 on the second surface 200b of the first upper semiconductor substrate 200 may be removed. Subsequently, the dummy contact 1120 exposed by the removed sacrificial film 1110 may be removed.

Thus, a first penetration hole 250h penetrating the first upper semiconductor substrate 200 and the upper interlayer insulation film 240 may be formed. In exemplary embodiments of the present inventive concept, the first penetration hole 250h may expose a part of the lower interlayer insulation film 140.

Figure 26:
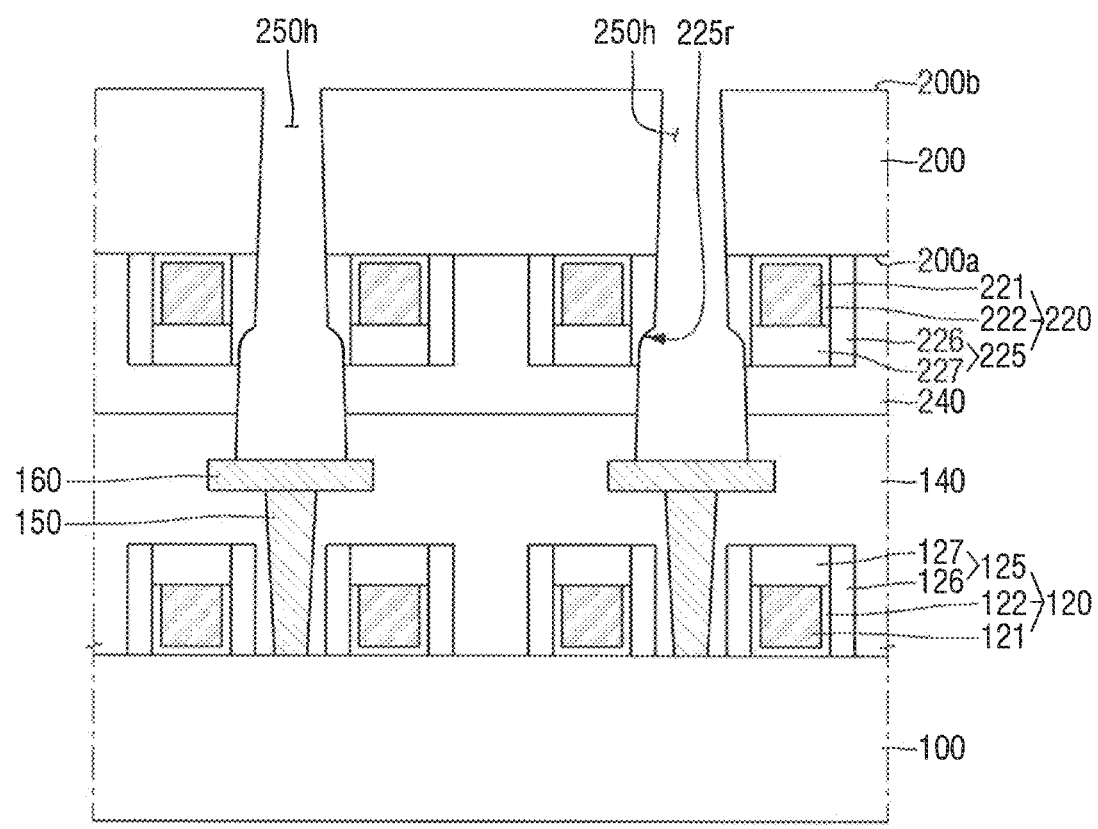

Referring to FIG. 26, a part of the exposed lower interlayer insulation film 140 is removed.

For example, an etching process for removing a part of the exposed lower interlayer insulation film 140 may be performed. The etching process may include, for example, but is not limited to, a wet etching process and/or a dry etching process. Therefore, the first penetration hole 250h for exposing the first conductive pad 160 may be formed.

Subsequently, referring to FIGS. 1 and 2, the first upper contact 250 is formed in the first penetration hole 250h. In other words, the dummy contact 1120 of FIG. 24 may be replaced with the first upper contact 250.

Therefore, the first upper contact 250 may be connected to the first conductive pad 160. The first upper contact 250 may be disposed on the side surface of the first upper gate structure 220. In addition, at least a part of the side surface of the first upper contact 250 may be defined by the side surface of the first upper gate structure 220. In addition, the first upper contact 250 may penetrate the first upper semiconductor substrate 200 and the upper interlayer insulation film 240. In exemplary embodiments of the present inventive concept, the width of the first upper contact 250 may decrease toward the first upper semiconductor substrate 200. In exemplary embodiments of the present inventive concept, a part of the first upper contact 250 may fill the first recess 225r.

Thus, it is possible to provide a method for fabricating a semiconductor device having an improved degree of integration and reliability.

Figure 27:
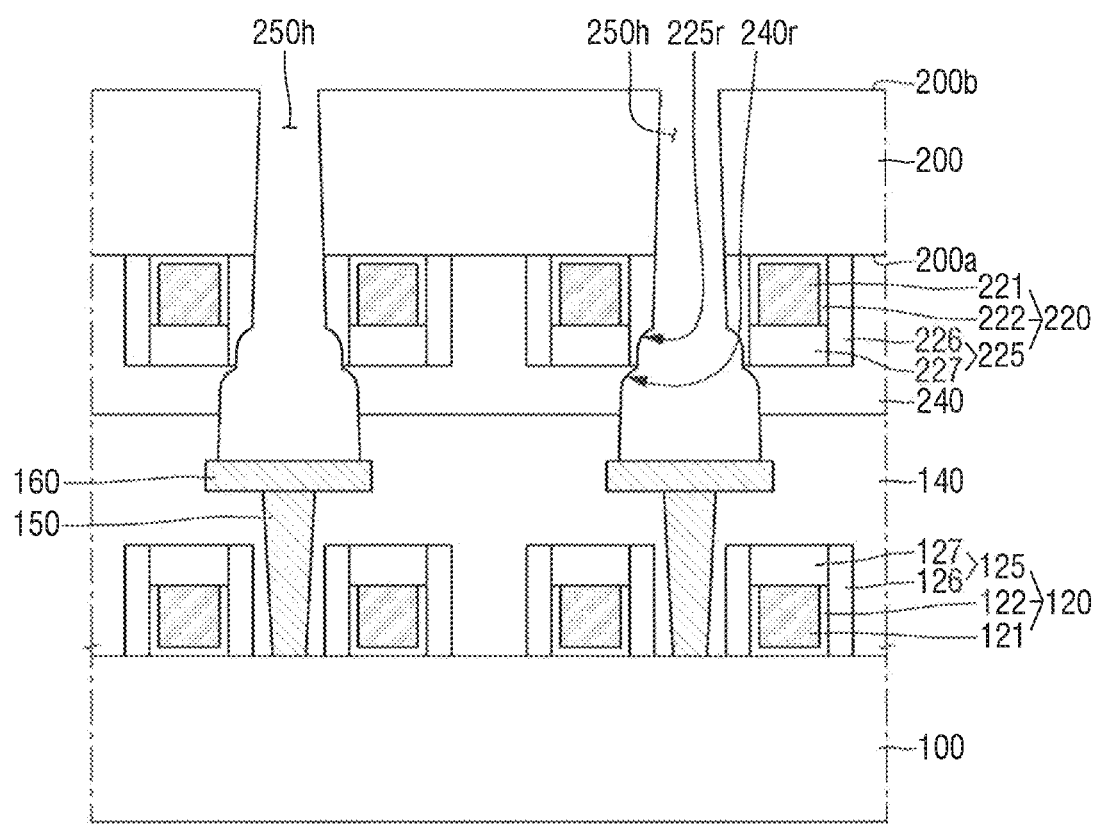
FIG. 27 is an intermediate stage diagram illustrating a method for fabricating a semiconductor device according to exemplary embodiments of the present inventive concept.

FIG. 27 is an intermediate stage diagram illustrating the method for fabricating the semiconductor device according to exemplary embodiments of the present inventive concept. For convenience, descriptions for elements already described with reference to FIGS. 1 to 26 may not be provided. For reference, FIG. 27 is a diagram illustrating the stages subsequent to FIG. 25.

Referring to FIG. 27, a part of the exposed lower interlayer insulation film 140 is removed, using the wet etching process.

Therefore, the first interlayer insulation films 140 and 240 including the third recess 240r may be formed. The third recess 240r may be adjacent to the bottom surface of the first upper insulation structure 225 and may have a concave shape. In exemplary embodiments of the present inventive concept, the side surface of the upper interlayer insulation film 240 may include the third recess 240r.

Subsequently, referring to FIG. 7, a first upper contact 250 is formed in the first penetration hole 250h.

Therefore, a part of the first upper contact 250 may fill the third recess 240r.

Figure 28:
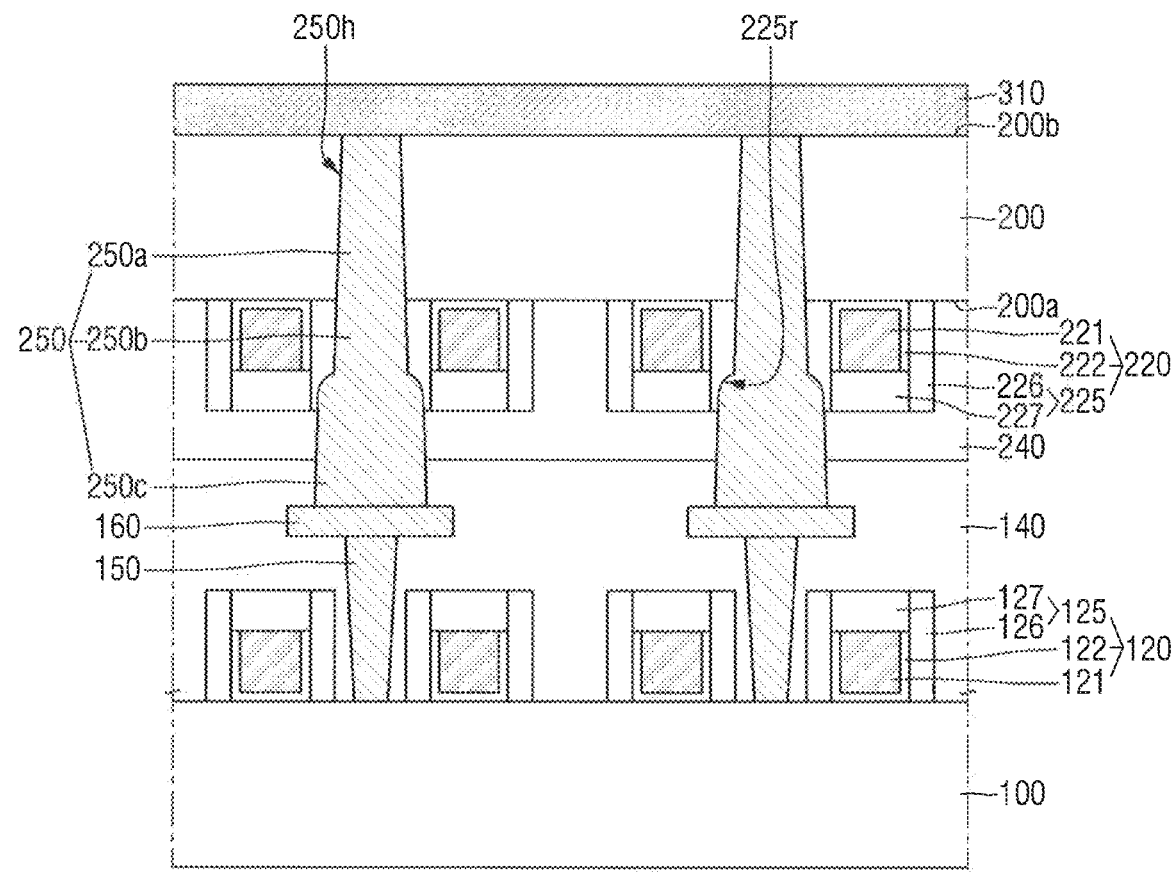
FIG. 28 is an intermediate stage diagram illustrating a method for fabricating a semiconductor device according to exemplary embodiments of the present inventive concept.

FIG. 28 is an intermediate stage diagram illustrating the method for fabricating the semiconductor device according to exemplary embodiments of the present inventive concept. For convenience, descriptions for elements already described with reference to FIGS. 1 to 26 may not be provided. For reference, FIG. 28 is a diagram illustrating the stages subsequent to FIG. 1.

Referring to FIG. 28, the channel adjustment film 310 is formed on the second surface 200b of the first upper semiconductor substrate 200.

In exemplary embodiments of the present inventive concept, the channel adjustment film 310 may be formed directly on the second surface 200b of the first upper semiconductor substrate 200. Therefore, channel characteristics of the transistor including the first upper gate structure 220 may be adjusted. The channel adjustment film 310 may be formed, for example, by a deposition process, but is not limited thereto.

In exemplary embodiments of the present inventive concept, the channel adjustment film 310 may apply a compressive stress or a tensile stress to the first upper semiconductor substrate 200.

In exemplary embodiments of the present inventive concept, the channel adjustment film 310 may include a ferroelectric. The channel adjustment film 310 including the ferroelectric may provide a negative capacitance component to the transistor including the first upper gate structure 220.

In exemplary embodiments of the present inventive concept, the channel adjustment film 310 may include an impurity to be diffused into the first upper semiconductor substrate 200. For example, the channel adjustment film 310 may include borophosphosilicate glass (BPSG).

In exemplary embodiments of the present inventive concept, the channel adjustment film 310 may include an insulation film and a work function metal film sequentially stacked on the second surface 200b of the first upper semiconductor substrate 200.

Figure 29:
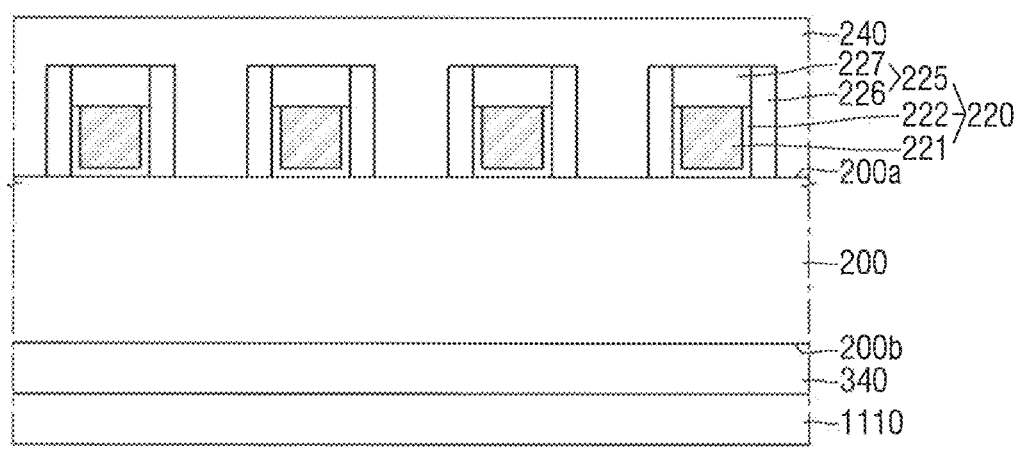
FIGS. 29, 30 and 31 are intermediate stage diagrams illustrating a method for fabricating a semiconductor device according to exemplary embodiments of the present inventive concept.
Figure 30:
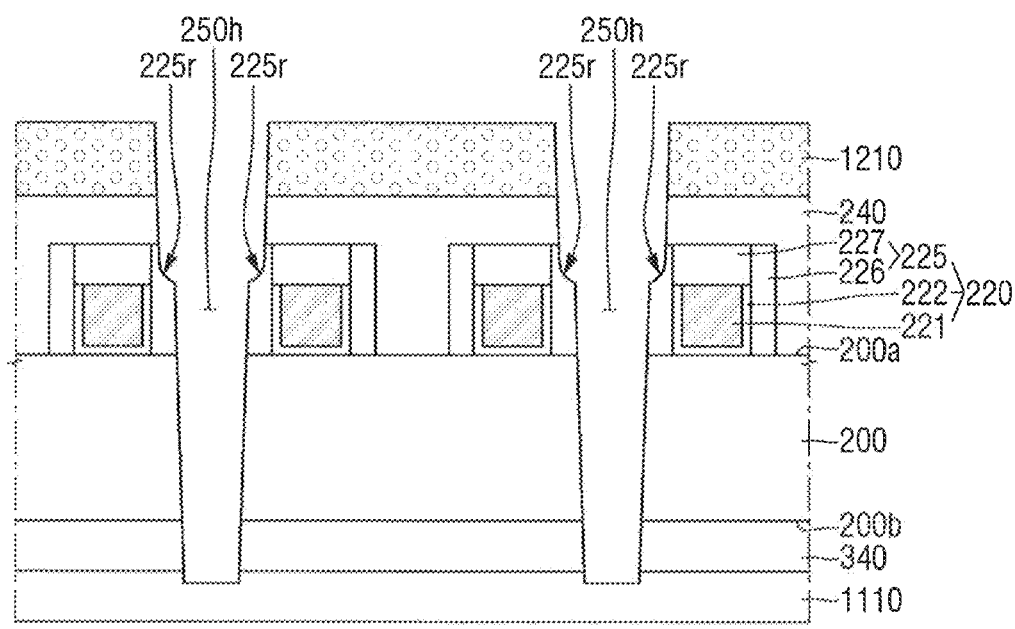
Figure 31:
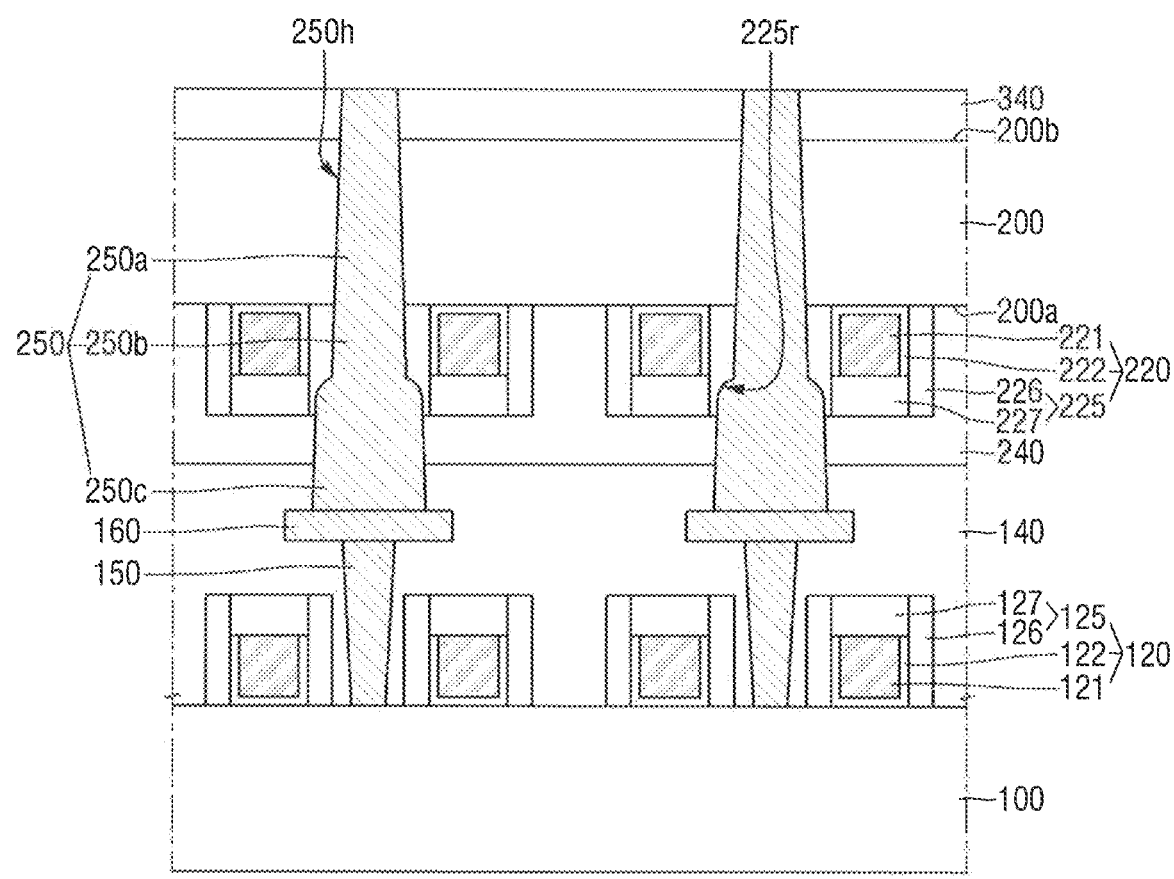

FIGS. 29 to 31 are intermediate stage diagrams illustrating the method for fabricating the semiconductor device according to exemplary embodiments of the present inventive concept. For convenience, descriptions for elements already described with reference to FIGS. 1 to 26 may not be provided.

Referring to FIG. 29, a second interlayer insulation film 340, a first upper semiconductor substrate 200, a first upper gate structure 220, and an upper interlayer insulation film 240 are formed on the sacrificial film 1110.

Since the formation of the first upper semiconductor substrate 200, the first upper gate structure 220 and the upper interlayer insulation film 240 is similar to that described with reference to FIG. 21, a detailed description will not be provided below.

The second interlayer insulation film 340 may be interposed between the sacrificial film 1110 and the first upper semiconductor substrate 200. In other words, the second interlayer insulation film 340 may be formed on the second surface 200b of the first upper semiconductor substrate 200.

Referring to FIG. 30, the first penetration hole 250h penetrating the upper interlayer insulation film 240, the first upper semiconductor substrate 200, and the second interlayer insulation film 340 is formed.

Since the configuration is similar to that described in FIG. 22 except that the first penetration holes 250h penetrate the second interlayer insulation film 340 beyond the first upper semiconductor substrate 200, a detailed description thereof will not be provided below.

Subsequently, the stages described above in FIGS. 23 through 26 may be performed.

Subsequently, referring to FIG. 31, the first upper contact 250 is formed in the first penetration hole 250h.

Thus, the first upper contact 250 penetrating the second interlayer insulation film 340 beyond the first upper semiconductor substrate 200 may be formed.

Subsequently, referring to FIG. 14, the second conductive pad 360, the wirings 372 and 374, and the third interlayer insulation film 440 are formed on the second interlayer insulation film 340.

Thus, the transistor thrilled on the first upper semiconductor substrate 200 may be connected to an integrated circuit formed on the second surface 200b of the first upper semiconductor substrate 200.

Exemplary embodiments of the present inventive concept provide a semiconductor device with increased integration and reliability by forming a self-aligned contact (SAC) for preventing damage to an integrated circuit on an upper semiconductor substrate.

Exemplary embodiments of the present inventive concept also provide a method for fabricating the semiconductor device with increased integration and reliability by forming a self-aligned contact (SAC) for preventing damage to the integrated circuit on the upper semiconductor substrate.

While the present inventive concept has been particularly shown and described with reference to exemplary embodiments thereof, those skilled in the art will appreciate that many variations and modifications may be made thereto without departing from the principles of the present inventive concept as set forth by the following claims.

What is claimed is:

1. A semiconductor device, comprising:
a lower semiconductor substrate;
an upper semiconductor substrate overlapping the lower semiconductor substrate, the upper semiconductor substrate including a first surface and a second surface opposite to the first surface;
a first upper gate structure on the first surface of the upper semiconductor substrate;
a second upper gate structure on the first surface of the upper semiconductor substrate;
a first interlayer insulation film which covers the first upper gate structure, wherein the first interlayer insulation film is between the lower semiconductor substrate and the upper semiconductor substrate; and
an upper contact connected to the lower semiconductor substrate, wherein the upper contact includes a first protrusion with a curved shape and in contact with a first spacer that extends from the first surface of the upper semiconductor substrate to the first protrusion to form a curved side surface of the first upper gate structure and a second protrusion with a curved shape and in contact with a second spacer that extends from the first surface of the upper semiconductor substrate to the second protrusion to form a curved side surface of the second upper gate structure such that the upper contact is sandwiched between the first and second upper gate structures,
wherein the upper contact includes a first portion penetrating the upper semiconductor substrate, and a second portion having a side surface adjacent to the curved side surface of the first upper gate structure, and
a width of the first portion decreases toward the second surface,
wherein the second portion of the upper contact includes a third protrusion which is adjacent to a bottom surface of the first upper gate structure and protrudes toward the first upper gate structure, the third protrusion being formed on the same side of the upper contact as the first protrusion, the third protrusion being provided in a concave recess overlapped by the first upper gate structure in a direction perpendicular to the first surface of the upper semiconductor substrate, and wherein the first portion of the upper contact having the decreasing width and the third protrusion sandwich the first protrusion.

2. The semiconductor device of claim 1, further comprising:
a conductive pad connected to a bottom surface of the upper contact in the first interlayer insulation film; and
a lower contact which penetrates the first interlayer insulation film and connects the lower semiconductor substrate and the conductive pad.

3. The semiconductor device of claim 1, wherein a width of the second portion decreases toward the first surface.

4. The semiconductor device of claim 1, further comprising:
a channel adjustment film disposed on the second surface of the upper semiconductor substrate.

5. The semiconductor device of claim 4, wherein the channel adjustment film applies a compressive stress or a tensile stress to the upper semiconductor substrate.

6. The semiconductor device of claim 4, wherein the channel adjustment film includes a ferroelectric.

7. The semiconductor device of claim 4, wherein the channel adjustment film includes borophosphosilicate glass (BPSG).

8. The semiconductor device of claim 4, wherein the channel adjustment film includes a work function metal film, and a dielectric film between the upper semiconductor substrate and the work function metal film.

9. The semiconductor device of claim 1, further comprising:
a second interlayer insulation film on the second surface of the upper semiconductor substrate,
wherein the first portion of the upper contact penetrates the second interlayer insulation film.

10. The semiconductor device of claim 1, further comprising:
a source/drain region in the upper semiconductor substrate adjacent to the first upper gate structure,
wherein the first portion of the upper contact penetrates the source/drain region.

11. A semiconductor device, comprising:
a lower semiconductor substrate;
a lower gate structure on a surface of the lower semiconductor substrate;
a lower interlayer insulation film on the lower semiconductor substrate, wherein the lower interlayer insulation film covers the lower gate structure;
an upper semiconductor substrate overlapping the lower interlayer insulation film, wherein the upper semiconductor substrate includes a first surface and a second surface opposite to the first surface;
a first upper gate structure on the first surface of the upper semiconductor substrate;
a second upper gate structure on the first surface of the upper semiconductor substrate;
an upper interlayer insulation film on the upper semiconductor substrate, wherein the upper interlayer insulation film covers the first upper gate structure; and
an upper contact on a side surface of the first upper gate structure and a side surface of the second upper gate structure, wherein the upper contact penetrates the upper semiconductor substrate and the upper interlayer insulation film,
wherein a width of the upper contact at the same level as the second surface is smaller than a width of the upper contact at the same level as the first surface,
wherein the side surface of the first upper gate structure includes a first concave recess which is adjacent to a bottom surface of the first upper gate structure, the side surface of the second upper gate structure includes a second concave recess which is adjacent to a bottom surface of the second upper gate structure,
a first curved part of the upper contact is disposed in the first concave recess and a second curved part of the upper contact is disposed in the second concave recess such that the upper contact is sandwiched between the first and second upper gate structures,
a third curved part of the upper contact is formed on the same side of the upper contact as the first curved part, the third curved part being provided in a third concave recess overlapped by the first upper gate structure in a direction perpendicular to the first surface of the upper semiconductor substrate.

12. The semiconductor device of claim 11, further comprising:
a lower contact which is disposed in the lower interlayer insulation film and connects the lower semiconductor substrate and the upper contact.

13. The semiconductor device of claim 12, wherein a width of the lower contact decreases toward the surface of the lower semiconductor substrate.

14. The semiconductor device of claim 12, further comprising:
a lower source/drain region in the lower semiconductor substrate adjacent to a side surface of the lower gate structure; and
an upper source/drain region in the upper semiconductor substrate adjacent to the side surface of the first upper gate structure,
wherein the lower contact is connected to the lower source/drain region, and
the upper contact is connected to the upper source/drain region.

15. The semiconductor device of claim 11, wherein the upper semiconductor substrate includes an active pattern protruding toward the surface of the lower semiconductor substrate and extending in a first direction intersecting the perpendicular direction, and
the first upper gate structure extends in a second direction intersecting the first direction.

* * * * *